United States Patent
Cutter et al.

(10) Patent No.: US 9,917,597 B1
(45) Date of Patent: Mar. 13, 2018

(54) METHOD AND APPARATUS FOR ACCELERATED DATA COMPRESSION WITH HINTS AND FILTERING

(71) Applicant: Intel Corporation, Santa Clara, CA (US)

(72) Inventors: Daniel F. Cutter, Maynard, MA (US); Vinodh Gopal, Westborough, MA (US); James D. Guilford, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/382,031

(22) Filed: Dec. 16, 2016

(51) Int. Cl.
  *H03M 7/30* (2006.01)
  *H04L 29/06* (2006.01)

(52) U.S. Cl.
  CPC .......... *H03M 7/3086* (2013.01); *H04L 69/04* (2013.01); *H03M 7/30* (2013.01)

(58) Field of Classification Search
  CPC ........ H03M 7/30; H03M 7/3086; H04L 69/04
  USPC ...................................................... 341/70–90
  See application file for complete search history.

(56) References Cited

U.S. PATENT DOCUMENTS

| 7,162,584 B2* | 1/2007 | Adl-Tabatabai | .... G06F 12/0862 710/68 |
| 2013/0054835 A1* | 2/2013 | Sliger | ..................... H04L 67/38 709/247 |

OTHER PUBLICATIONS

Intel Corporation, "IA-32 Intel® Architecture Software Developer's Manual—vol. 2: Instruction Set Reference", 978 pages, 2003.
Deutsch, Peter. DEFLATE compressed data format specification version 1.3. No. RFC 1951. 1996: http://www.faqs.org/rfcs/rfc1951. html; 15 pages.
Huffman, D. A., "A Method for the Construction of Minimum Redundancy Codes", Proceedings of the Institute of Radio Engineers, Sep. 1952, vol. 40, No. 9, pp. 1098-1101; 4 pages, Sep. 9, 1952.
Ziv J., Lempel A., "A Universal Algorithm for Sequential Data Compression", IEEE Transactions on Information Theory, vol. 23, No. 3, pp. 337-343; 7 pages, May 1, 1977.
Gailly, Jean-loup. "GNU gzip." (2016); 30 pages.

* cited by examiner

*Primary Examiner* — Lam T Mai
(74) *Attorney, Agent, or Firm* — Alliance IP, LLC

(57) ABSTRACT

A processor includes a decoder to decode an instruction to compress an input data stream and an execution unit for executing the instruction. The execution unit to generate metadata for a current input of the input data stream, the metadata comprises a first hint based on a portion of a current input that represents the input data stream at a current offset, select a first pointer to identify a location in a history buffer in a hash chain, determine whether the metadata generated for the current input matches metadata previously generated for the first pointer, and filter the first pointer from a search for a best match for the current input in the history buffer based on the determination that at least a portion of the metadata for the current input does not match a portion of the metadata for the first pointer.

20 Claims, 18 Drawing Sheets

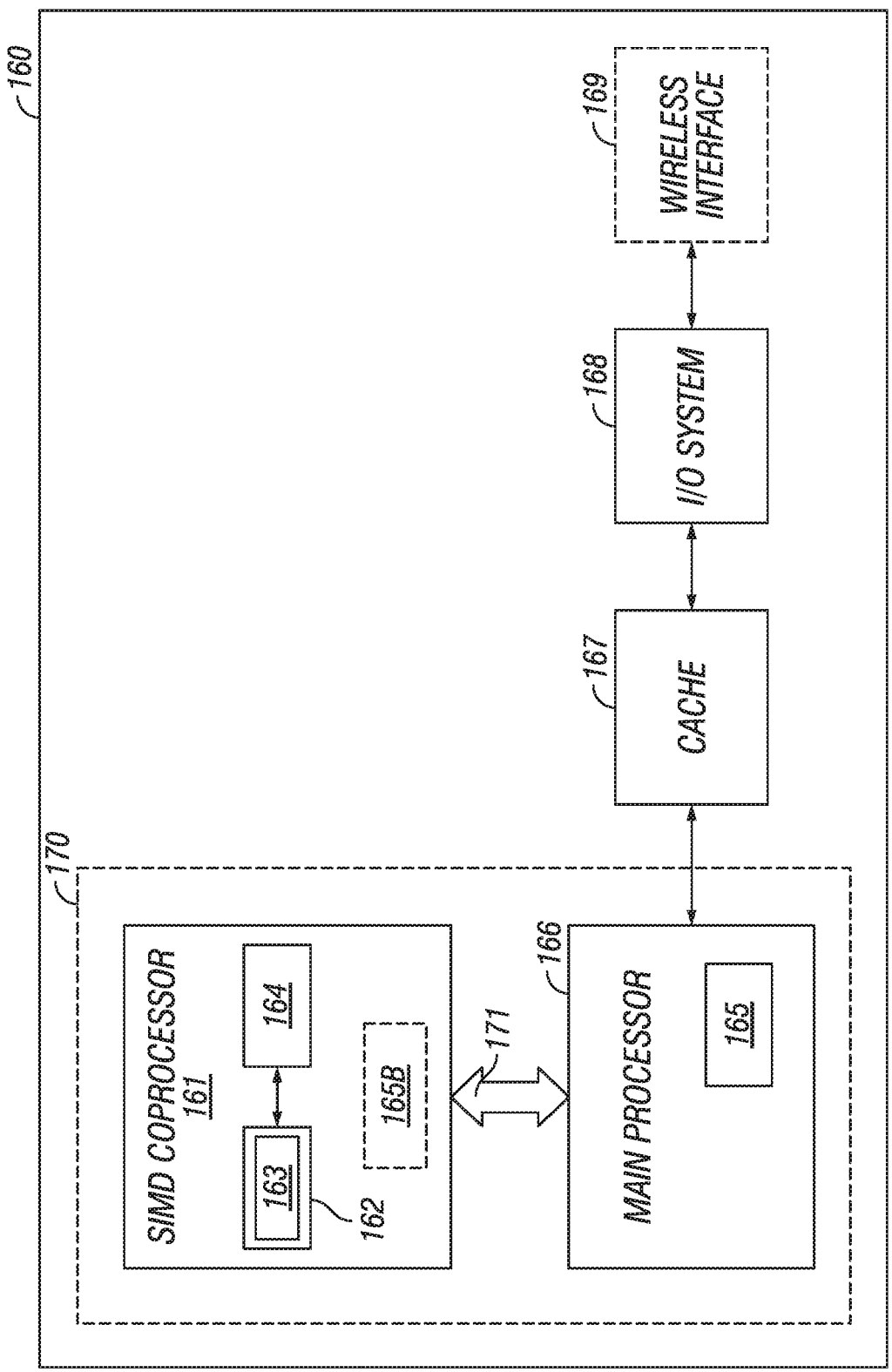

METHOD AND APPARATUS FOR ACCELERATED DATA COMPRESSION WITH HINTS AND FILTERING

FIELD OF THE INVENTION

The present disclosure pertains to the field of processing logic, microprocessors, and associated instruction set architecture that, when executed by the processor or other processing logic, perform logical, mathematical, or other functional operations.

DESCRIPTION OF RELATED ART

Multiprocessor systems are becoming more and more common. Applications of multiprocessor systems include dynamic domain partitioning all the way down to desktop computing. In order to take advantage of multiprocessor systems, code to be executed may be separated into multiple threads for execution by various processing entities. Each thread may be executed in parallel with one another. Pipelining of applications may be implemented in systems in order to more efficiently execute applications. Instructions as they are received on a processor may be decoded into terms or instruction words that are native, or more native, for execution on the processor. Processors may be implemented in a system on chip.

Processors may utilize data compressors to reduce the size of data using LZ77 encoding. Data compressors may be used in media processing such as image processing or video processing. Wearable devices, internet-of-things (IoT) devices, and ubiquitous sensing systems may utilize LZ77 data compression.

DESCRIPTION OF THE FIGURES

Embodiments are illustrated by way of example and not limitation in the Figures of the accompanying drawings:

FIG. 1C is a block diagram illustrating other embodiments of a data processing system for performing text string comparison operations;

DETAILED DESCRIPTION

Figure 1A:
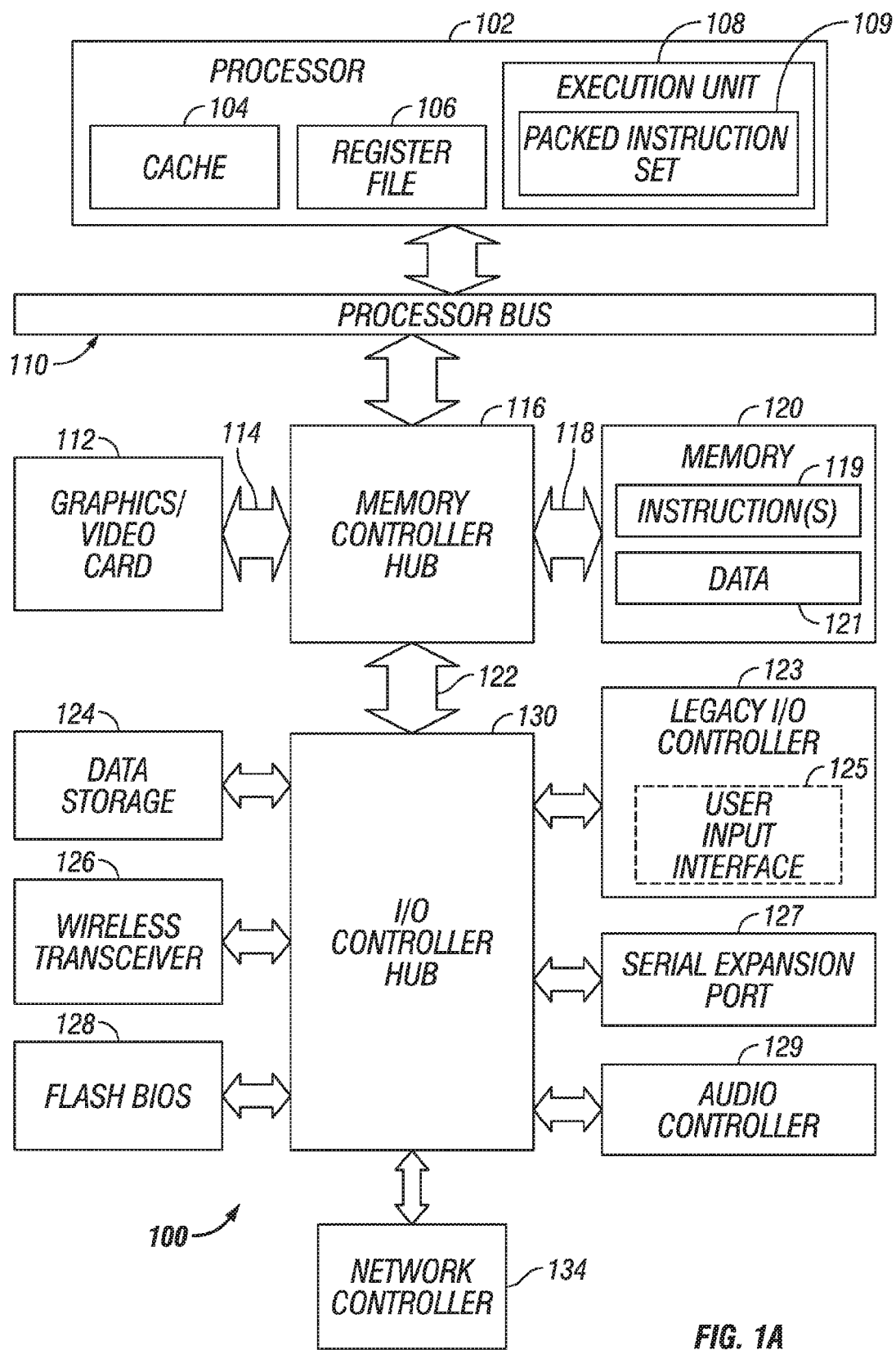
FIG. 1A is a block diagram of an exemplary computer system formed with a processor that may include execution units to execute an instruction, in accordance with embodiments of the present disclosure.

The following description describes an instruction and processing logic for data compression acceleration based on hints and filtering. Such a processing apparatus may include an out-of-order processor. In the following description, numerous specific details such as processing logic, processor types, micro-architectural conditions, events, enablement mechanisms, and the like are set forth in order to provide a more thorough understanding of embodiments of the present disclosure. It will be appreciated, however, by one skilled in the art that the embodiments may be practiced without such specific details. Additionally, some well-known structures, circuits, and the like have not been shown in detail to avoid unnecessarily obscuring embodiments of the present disclosure.

Although the following embodiments are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the embodiments are not limited to processors or machines that perform 512-bit, 256-bit, 128-bit, 64-bit, 32-bit, or 16-bit data operations and may be applied to any processor and machine in which manipulation or management of data may be performed. In addition, the following description provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that may be programmed with the instructions to perform the operations of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Furthermore, operations of embodiments of the present disclosure might be performed by specific hardware components that contain fixed-function logic for performing the operations, or by any combination of programmed computer components and fixed-function hardware components. Throughout this disclosure, unless explicitly stated otherwise, a compound form of a reference numeral refers to the element generically or collectively. Thus, for example, widget 101A or 101-1 refers to an instance of a widget class, which may be referred to collectively as widgets 101 and any one of which may be referred to generically as widget 101.

Instructions used to program logic to perform embodiments of the present disclosure may be stored within a memory in the system, such as DRAM, cache, flash memory, or other storage. Furthermore, the instructions may be distributed via a network or by way of other computer-readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium may include any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as may be useful in simulations, the hardware may be represented using a hardware description language or another functional description language. Additionally, a circuit level model with logic and/or transistor gates may be produced at some stages of the design process. Furthermore, designs, at some stage, may reach a level of data representing the physical placement of various devices in the hardware model. In cases wherein some semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine-readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy may be made. Thus, a communication provider or a network provider may store on a tangible, machine-readable medium, at least temporarily, an article, such as information encoded into a carrier wave, embodying techniques of embodiments of the present disclosure.

In modern processors, a number of different execution units may be used to process and execute a variety of code and instructions. Some instructions may be quicker to complete while others may take a number of clock cycles to complete. The faster the throughput of instructions, the better the overall performance of the processor. Thus it would be advantageous to have as many instructions execute as fast as possible. However, there may be certain instructions that have greater complexity and require more in terms of execution time and processor resources, such as floating point instructions, load/store operations, data moves, etc.

As more computer systems are used in internet, text, and multimedia applications, additional processor support has been introduced over time. In one embodiment, an instruction set may be associated with one or more computer architectures, including data types, instructions, register architecture, addressing modes, memory architecture, interrupt and exception handling, and external input and output (I/O).

In one embodiment, the instruction set architecture (ISA) may be implemented by one or more micro-architectures, which may include processor logic and circuits used to implement one or more instruction sets. Accordingly, processors with different micro-architectures may share at least a portion of a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. Similarly, processors designed by other processor development companies, such as ARM Holdings, Ltd., MIPS, or their licensees or adopters, may share at least a portion of a common instruction set, but may include different processor designs. For example, the same register architecture of the ISA may be implemented in different ways in different micro-architectures using new or well-known techniques, including dedicated physical registers, one or more dynamically allocated physical registers using a register renaming mechanism (e.g., the use of a Register Alias Table (RAT), a Reorder Buffer (ROB) and a retirement register file. In one embodiment, registers may include one or more registers, register architectures, register files, or other register sets that may or may not be addressable by a software programmer.

An instruction may include one or more instruction formats. In one embodiment, an instruction format may indicate various fields (number of bits, location of bits, etc.) to specify, among other things, the operation to be performed and the operands on which that operation will be performed. In a further embodiment, some instruction formats may be further defined by instruction templates (or sub-formats). For example, the instruction templates of a given instruction format may be defined to have different subsets of the instruction format's fields and/or defined to have a given field interpreted differently. In one embodiment, an instruction may be expressed using an instruction format (and, if defined, in a given one of the instruction templates of that instruction format) and specifies or indicates the operation and the operands upon which the operation will operate.

Scientific, financial, auto-vectorized general purpose, RMS (recognition, mining, and synthesis), and visual and multimedia applications (e.g., 2D/3D graphics, image processing, video compression/decompression, voice recognition algorithms and audio manipulation) may require the same operation to be performed on a large number of data items. In one embodiment, Single Instruction Multiple Data (SIMD) refers to a type of instruction that causes a processor to perform an operation on multiple data elements. SIMD technology may be used in processors that may logically divide the bits in a register into a number of fixed-sized or variable-sized data elements, each of which represents a separate value. For example, in one embodiment, the bits in a 64-bit register may be organized as a source operand containing four separate 16-bit data elements, each of which represents a separate 16-bit value. This type of data may be referred to as 'packed' data type or 'vector' data type, and operands of this data type may be referred to as packed data operands or vector operands. In one embodiment, a packed data item or vector may be a sequence of packed data elements stored within a single register, and a packed data operand or a vector operand may a source or destination operand of a SIMD instruction (or 'packed data instruction' or a 'vector instruction'). In one embodiment, a SIMD instruction specifies a single vector operation to be performed on two source vector operands to generate a destination vector operand (also referred to as a result vector operand) of the same or different size, with the same or different number of data elements, and in the same or different data element order.

SIMD technology, such as that employed by the Intel® Core™ processors having an instruction set including x86, MIIVIX™, Streaming SIMD Extensions (SSE), SSE2, SSE3, SSE4.1, and SSE4.2 instructions, ARM processors, such as the ARM Cortex® family of processors having an instruction set including the Vector Floating Point (VFP) and/or NEON instructions, and MIPS processors, such as the Loongson family of processors developed by the Institute of Computing Technology (ICT) of the Chinese Academy of Sciences, has enabled a significant improvement in application performance (Core™ and MMX™ are registered trademarks or trademarks of Intel Corporation of Santa Clara, Calif.).

In one embodiment, destination and source registers/data may be generic terms to represent the source and destination of the corresponding data or operation. In some embodiments, they may be implemented by registers, memory, or other storage areas having other names or functions than those depicted. For example, in one embodiment, "DEST1" may be a temporary storage register or other storage area, whereas "SRC1" and "SRC2" may be a first and second source storage register or other storage area, and so forth. In other embodiments, two or more of the SRC and DEST storage areas may correspond to different data storage elements within the same storage area (e.g., a SIMD register). In one embodiment, one of the source registers may also act as a destination register by, for example, writing back the result of an operation performed on the first and second source data to one of the two source registers serving as a destination registers.

FIG. 1A is a block diagram of an exemplary computer system formed with a processor that may include execution units to execute an instruction, in accordance with embodiments of the present disclosure. System 100 may include a component, such as a processor 102 to employ execution units including logic to perform algorithms for process data, in accordance with the present disclosure, such as in the embodiment described herein. System 100 may be representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS' operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Embodiments of the present disclosure may be used in other devices such as handheld devices and embedded applications. Some examples of handheld devices include cellular phones, Internet Protocol devices, digital cameras, personal digital assistants (PDAs), and handheld PCs. Embedded applications may include a micro controller, a digital signal processor (DSP), system on a chip, network computers (NetPC), set-top boxes, network hubs, wide area network (WAN) switches, or any other system that may perform one or more instructions in accordance with at least one embodiment.

Computer system 100 may include a processor 102 that may include one or more execution units 108 to perform an algorithm to perform at least one instruction in accordance with one embodiment of the present disclosure. One embodiment may be described in the context of a single processor desktop or server system, but other embodiments may be included in a multiprocessor system. System 100 may be an example of a 'hub' system architecture. System 100 may include a processor 102 for processing data signals. Processor 102 may include a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. In one embodiment, processor 102 may be coupled to a processor bus 110 that may transmit data signals between processor 102 and other components in system 100. The elements of system 100 may perform conventional functions that are well known to those familiar with the art.

In one embodiment, processor 102 may include a Level 1 (L1) internal cache memory 104. Depending on the architecture, the processor 102 may have a single internal cache or multiple levels of internal cache. In another embodiment, the cache memory may reside external to processor 102. Other embodiments may also include a combination of both internal and external caches depending on the particular implementation and needs. Register file 106 may store different types of data in various registers including integer registers, floating point registers, status registers, and instruction pointer register.

Execution unit 108, including logic to perform integer and floating point operations, also resides in processor 102. Processor 102 may also include a microcode (ucode) ROM that stores microcode for certain macroinstructions. In one embodiment, execution unit 108 may include logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications may be accelerated and executed more efficiently by using the full width of a processor's data bus for performing operations on packed data. This may eliminate the need to transfer smaller units of data across the processor's data bus to perform one or more operations one data element at a time.

Embodiments of an execution unit 108 may also be used in micro controllers, embedded processors, graphics devices, DSPs, and other types of logic circuits. System 100 may include a memory 120. Memory 120 may be implemented as a dynamic random access memory (DRAM) device, a static random access memory (SRAM) device, flash memory device, or other memory device. Memory 120 may store instructions 119 and/or data 121 represented by data signals that may be executed by processor 102.

A system logic chip 116 may be coupled to processor bus 110 and memory 120. System logic chip 116 may include a memory controller hub (MCH). Processor 102 may communicate with MCH 116 via a processor bus 110. MCH 116 may provide a high bandwidth memory path 118 to memory 120 for storage of instructions 119 and data 121 and for storage of graphics commands, data and textures. MCH 116 may direct data signals between processor 102, memory 120, and other components in system 100 and to bridge the data signals between processor bus 110, memory 120, and system I/O 122. In some embodiments, the system logic chip 116 may provide a graphics port for coupling to a graphics controller 112. MCH 116 may be coupled to memory 120 through a memory interface 118. Graphics card 112 may be coupled to MCH 116 through an Accelerated Graphics Port (AGP) interconnect 114.

System 100 may use a proprietary hub interface bus 122 to couple MCH 116 to I/O controller hub (ICH) 130. In one embodiment, ICH 130 may provide direct connections to some I/O devices via a local I/O bus. The local I/O bus may include a high-speed I/O bus for connecting peripherals to memory 120, chipset, and processor 102. Examples may include the audio controller 129, firmware hub (flash BIOS) 128, wireless transceiver 126, data storage 124, legacy I/O controller 123 containing user input interface 125 (which may include a keyboard interface), a serial expansion port 127 such as Universal Serial Bus (USB), and a network controller 134. Data storage device 124 may comprise a hard disk drive, a floppy disk drive, a CD-ROM device, a flash memory device, or other mass storage device.

For another embodiment of a system, an instruction in accordance with one embodiment may be used with a system on a chip. One embodiment of a system on a chip comprises of a processor and a memory. The memory for one such system may include a flash memory. The flash memory may be located on the same die as the processor and other system components. Additionally, other logic blocks such as a memory controller or graphics controller may also be located on a system on a chip.

Figure 1B:
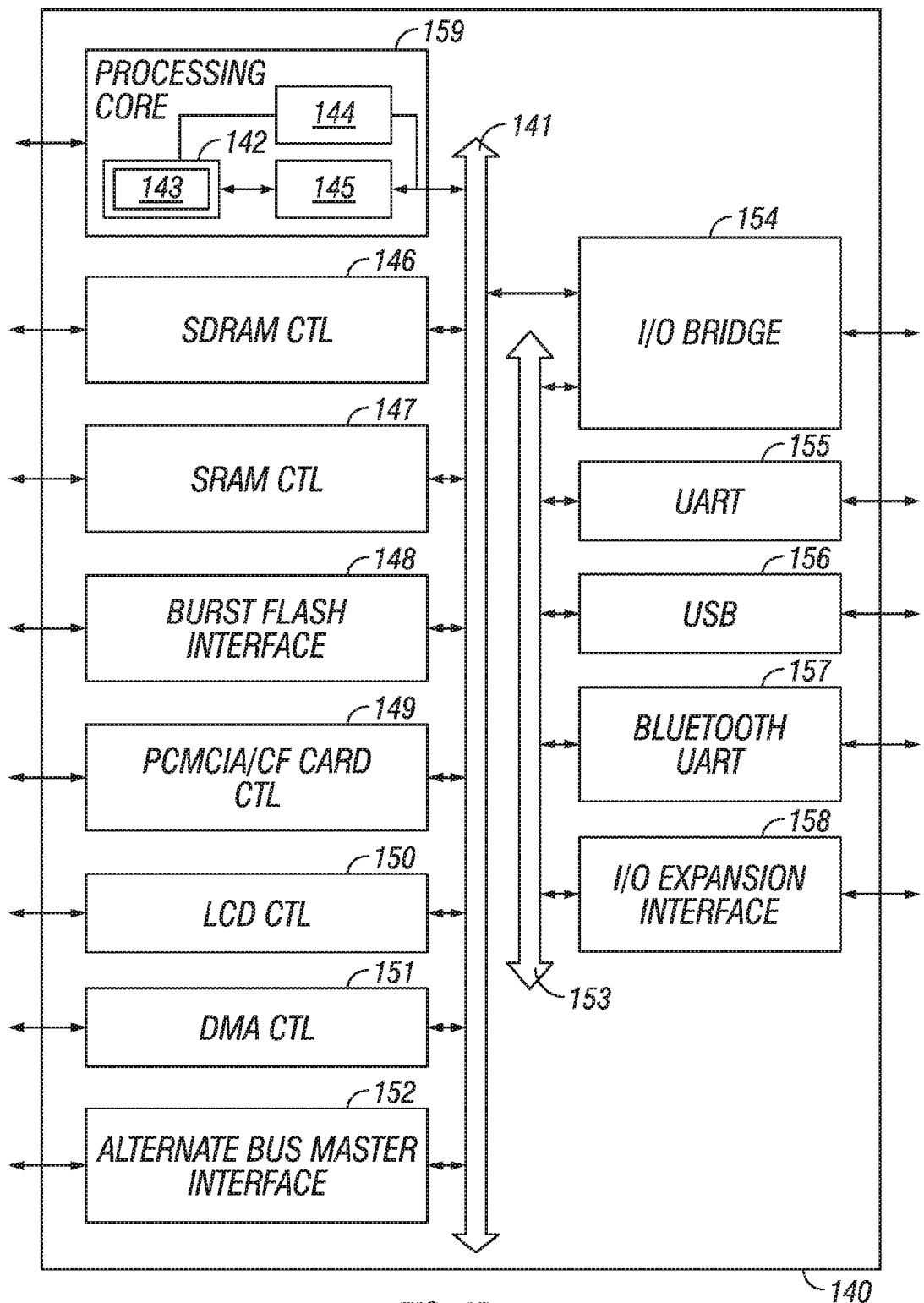
FIG. 1B is a block diagram illustrating a data processing system, in accordance with embodiments of the present disclosure.

FIG. 1B illustrates a data processing system 140 which implements the principles of embodiments of the present disclosure. It will be readily appreciated by one of skill in the art that the embodiments described herein may operate with alternative processing systems without departure from the scope of embodiments of the disclosure.

Computer system 140 comprises a processing core 159 for performing at least one instruction in accordance with one embodiment. In one embodiment, processing core 159 represents a processing unit of any type of architecture, including but not limited to a CISC, a RISC or a VLIW type architecture. Processing core 159 may also be suitable for manufacture in one or more process technologies and by being represented on a machine-readable media in sufficient detail, may be suitable to facilitate said manufacture.

Processing core 159 comprises an execution unit 142, a set of register files 145, and a decoder 144. Processing core 159 may also include additional circuitry (not shown) which may be unnecessary to the understanding of embodiments of the present disclosure. Execution unit 142 may execute instructions received by processing core 159. In addition to performing typical processor instructions, execution unit 142 may perform instructions in packed instruction set 143 for performing operations on packed data formats. Packed instruction set 143 may include instructions for performing embodiments of the disclosure and other packed instructions. Execution unit 142 may be coupled to register file 145 by an internal bus. Register file 145 may represent a storage area on processing core 159 for storing information, including data. As previously mentioned, it is understood that the storage area may store the packed data might not be critical. Execution unit 142 may be coupled to decoder 144. Decoder 144 may decode instructions received by processing core 159 into control signals and/or microcode entry points. In response to these control signals and/or microcode entry points, execution unit 142 performs the appropriate operations. In one embodiment, the decoder may interpret the opcode of the instruction, which will indicate what operation should be performed on the corresponding data indicated within the instruction.

Processing core 159 may be coupled with bus 141 for communicating with various other system devices, which may include but are not limited to, for example, synchronous dynamic random access memory (SDRAM) control 146, static random access memory (SRAM) control 147, burst flash memory interface 148, personal computer memory card international association (PCMCIA)/compact flash (CF) card control 149, liquid crystal display (LCD) control 150, direct memory access (DMA) controller 151, and alternative bus master interface 152. In one embodiment, data processing system 140 may also comprise an I/O bridge 154 for communicating with various I/O devices via an I/O bus 153. Such I/O devices may include but are not limited to, for example, universal asynchronous receiver/transmitter (UART) 155, universal serial bus (USB) 156, Bluetooth wireless UART 157 and I/O expansion interface 158.

One embodiment of data processing system 140 provides for mobile, network and/or wireless communications and a processing core 159 that may perform SIMD operations including a text string comparison operation. Processing core 159 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

FIG. 1C illustrates other embodiments of a data processing system that performs SIMD text string comparison operations. In one embodiment, data processing system 160 may include a main processor 166, a SIMD coprocessor 161, a cache memory 167, and an input/output system 168. Input/output system 168 may optionally be coupled to a wireless interface 169. SIMD coprocessor 161 may perform operations including instructions in accordance with one embodiment. In one embodiment, processing core 170 may be suitable for manufacture in one or more process technologies and by being represented on a machine-readable media in sufficient detail, may be suitable to facilitate the manufacture of all or part of data processing system 160 including processing core 170.

In one embodiment, SIMD coprocessor 161 comprises an execution unit 162 and a set of register files 164. One embodiment of main processor 166 comprises a decoder 165 to recognize instructions of instruction set 163 including instructions in accordance with one embodiment for execution by execution unit 162. In other embodiments, SIMD coprocessor 161 also comprises at least part of decoder 165 (shown as 165B) to decode instructions of instruction set 163. Processing core 170 may also include additional circuitry (not shown) which may be unnecessary to the understanding of embodiments of the present disclosure.

In operation, main processor 166 executes a stream of data processing instructions that control data processing operations of a general type including interactions with cache memory 167, and input/output system 168. Embedded within the stream of data processing instructions may be SIMD coprocessor instructions. Decoder 165 of main processor 166 recognizes these SIMD coprocessor instructions as being of a type that should be executed by an attached SIMD coprocessor 161. Accordingly, main processor 166 issues these SIMD coprocessor instructions (or control signals representing SIMD coprocessor instructions) on the coprocessor bus 171. From coprocessor bus 171, these instructions may be received by any attached SIMD coprocessors. In this case, SIMD coprocessor 161 may accept and execute any received SIMD coprocessor instructions intended for it.

Data may be received via wireless interface 169 for processing by the SIMD coprocessor instructions. For one example, voice communication may be received in the form of a digital signal, which may be processed by the SIMD coprocessor instructions to regenerate digital audio samples representative of the voice communications. For another example, compressed audio and/or video may be received in the form of a digital bit stream, which may be processed by the SIMD coprocessor instructions to regenerate digital audio samples and/or motion video frames. In one embodiment of processing core 170, main processor 166, and a SIMD coprocessor 161 may be integrated into a single processing core 170 comprising an execution unit 162, a set of register files 164, and a decoder 165 to recognize instructions of instruction set 163 including instructions in accordance with one embodiment.

Figure 2:
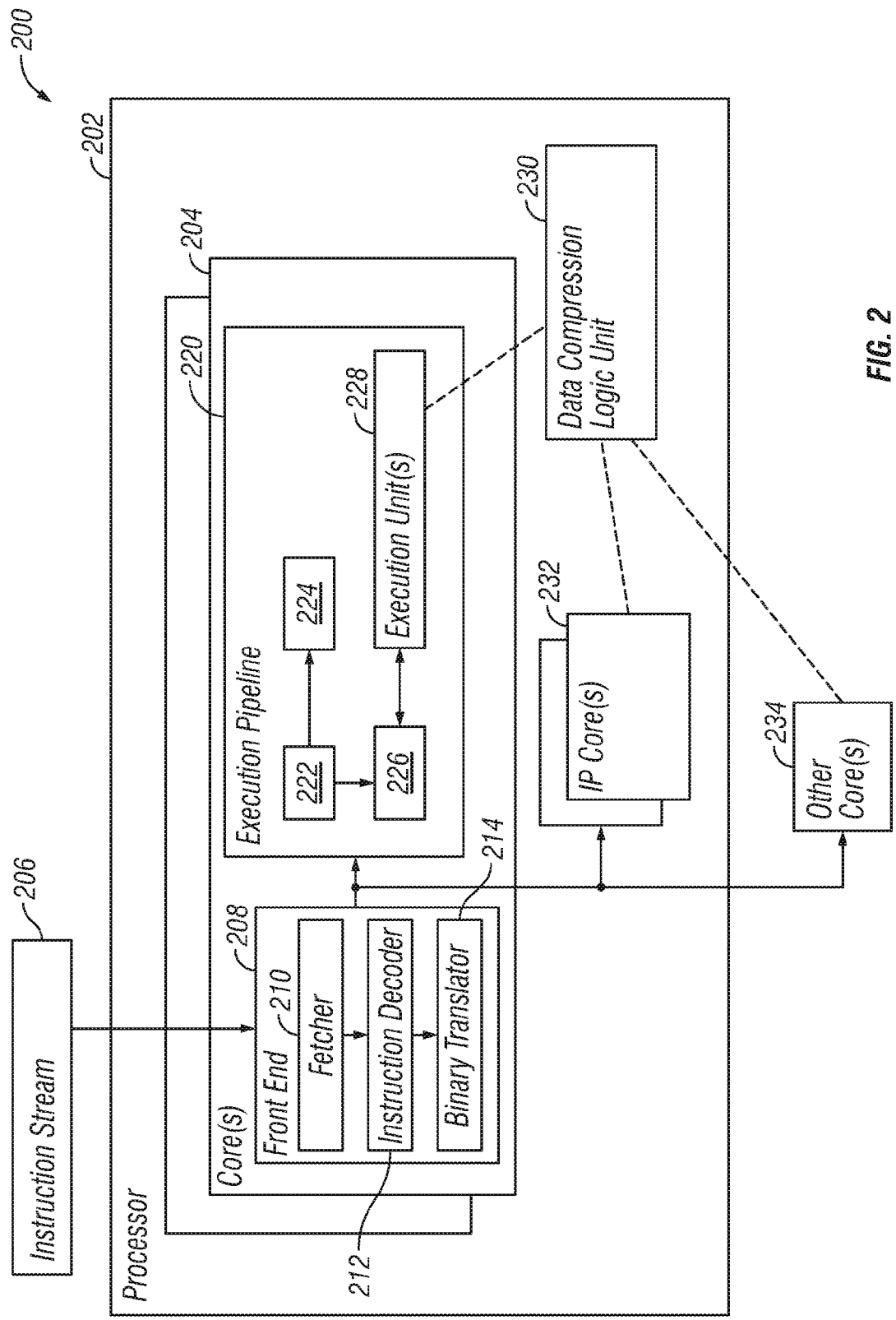
FIG. 2 is a block diagram illustrating an example system for accelerated data compression, in accordance with embodiments of the present disclosure.

Embodiments of the present disclosure involve methods and systems for data compression acceleration based on hints and filtering. FIG. 2 is an illustration of a system for data compression acceleration, in accordance with embodiments of the present disclosure. System 200 may include any suitable number and kind of elements to perform the operations described herein, including a processor, SoC, integrated circuit, or other mechanism. Furthermore, although specific elements of system 200 may be described herein as performing a specific function, any suitable portion of system 200 may perform the functionality described herein. For example, system 200 may include processor 202. Although processor 202 is shown and described as an example in FIG. 2, any suitable mechanism may be used. Processor 202 may include any suitable mechanism for performing data compression acceleration based on hints and filtering. In at least one embodiment, such mechanisms may be implemented in hardware. Processor 202 may be implemented fully or in part by the elements described in FIGS. 1-15.

Lossless data compression may be used to reduce data storage or data transmission requirements. Data compression may be performed in, for example, media compression, transmission or reception of HTTP traffic, database applications, storage systems, compressed file systems, or networking systems. In some systems, LZ77-based data compression algorithms, such as the DEFLATE algorithm, may be implemented by a circuit that searches for the longest data in a history buffer that matches the current data in an input buffer. The history buffer may be a sliding window representing the most recent data from an input data stream that was compressed.

The search for the longest data in the history buffer may be accelerated by using a hash chain. A hash chain may include a plurality of pointers to locations in the history buffer. The pointers in the hash chain may share a common hash value. The hash chain may be indexed in a hash table. An entry in the hash table may be accessed using a hash value of the current input. The hash value may be the output of a function of a prefix of the current input. The hash table may return a hash table record, which may reference a spill table record. The spill table may be a circular buffer, which may include thousands of spill table records. Some spill table records may reference other spill table records in the same hash chain. The number of locations searched in the history buffer or the number of iterations for a search may be controlled by a compression level setting. For example, Gzip defines 9 levels of compression, where level 9 corresponds to the greatest number of searches or the greatest amount of compression. As the number of searches or iterations of searches increases, however, the required amount of processing may also increase.

In some embodiments of the present disclosure, data compression may be performed based on hints and filtering, which may reduce the amount of processing required to find the longest matching data or a "good enough" match in the history buffer. In one embodiment, system 200 may include data compression logic unit 230 for performing data compression acceleration based on hints and filtering. System 200 may include data compression logic unit 230 in any suitable portion of system 200. In one embodiment, data compression logic unit 230 may be implemented as part of an execution unit 228, which may be within execution pipeline 220. In another embodiment, data compression logic unit 230 may be implemented within intellectual property (IP) core(s) 232, which may be separate from main core(s) 204 of processor 202. In a further embodiment, data compression logic unit 230 may be implemented in other core(s) 234, which may be separate from processor 202. Data compression logic unit 230 may be implemented by any suitable combination of circuitry or hardware computational logic of a processor, including but not limited to fixed-function logic for performing data compression, or by any combination of programmed computer components and fixed-function hardware components.

Data compression logic unit 230 may be invoked in any suitable manner. For example, data compression logic unit 230 may be implicitly or explicitly invoked by instructions executing on system 200. Data compression logic unit 230 may be implicitly invoked by a core. When, given a software instruction to compress data, the core may carry out the software instruction by accessing data compression logic unit 230. Data compression logic unit 230 may be explicitly invoked by a core when an instruction, which may be created by a compiler, interpreter, or other entity with knowledge of the specific configuration of processor 202, identifies data compression logic unit 230 to handle data compression. Data compression logic unit 230 may compress data more efficiently than other execution units 228 or IP cores 232 or 234 that are to perform general arithmetic or mathematical operations.

Instructions to be processed by processor 202 or a core 204 may be received via instruction stream 206. Although instruction stream 206 is shown external to processor 202 and core 204, the instruction stream may be included in any suitable portion of system 200 for providing instructions. For processing an instruction, the front end 208 of a core 204 of processor 200 may fetch an instruction. For example, an instruction fetcher 210 may fill the processing pipeline efficiently with possible instructions to execute. Front end 208 may also include an instruction decoder 212 to decode an instruction into opcodes for execution, which may determine the meaning, side effects, data required, data consumed, and data to be produced for the instruction. In some embodiments, a binary translator 214 may be used to optimize or improve the efficiency of code.

The decoded instructions may be passed to an out-of-order or in-order execution unit in an execution pipeline 220. Execution pipeline 220 may include a rename and allocate unit 222 for renaming instructions for out-of-order execution, and a reorder buffer (ROB) coextensive with a retirement unit 226 so that instructions may appear to be retired in the order that they were received. Rename and allocate unit 222 may further rename or allocate resources for execution of multiple instructions in parallel. Scheduler 224 may schedule or allocate instructions to execute on execution units 228 when inputs are available. Outputs of execution units 228 may queue in the ROB 226. Front end 208 may attempt to anticipate any behaviors that will prevent instructions from executing in a sequential stream and may fetch streams of instructions that might execute. When there is, for example, a misprediction of a branch, the ROB 226 may inform the front end 208, and a different set of instructions might be executed instead. Front end 208 may store data, such as data for branch prediction. The instructions may be retired as if they were executed in program order. Various portions of such execution pipelining may be performed by one or more core 204. Each core 204 may include one or more threads or logical cores for execution.

Although various operations are described in this disclosure as being performed by specific components of processor 202, the functionality may be performed by any suitable portion of processor 202.

Figure 3:
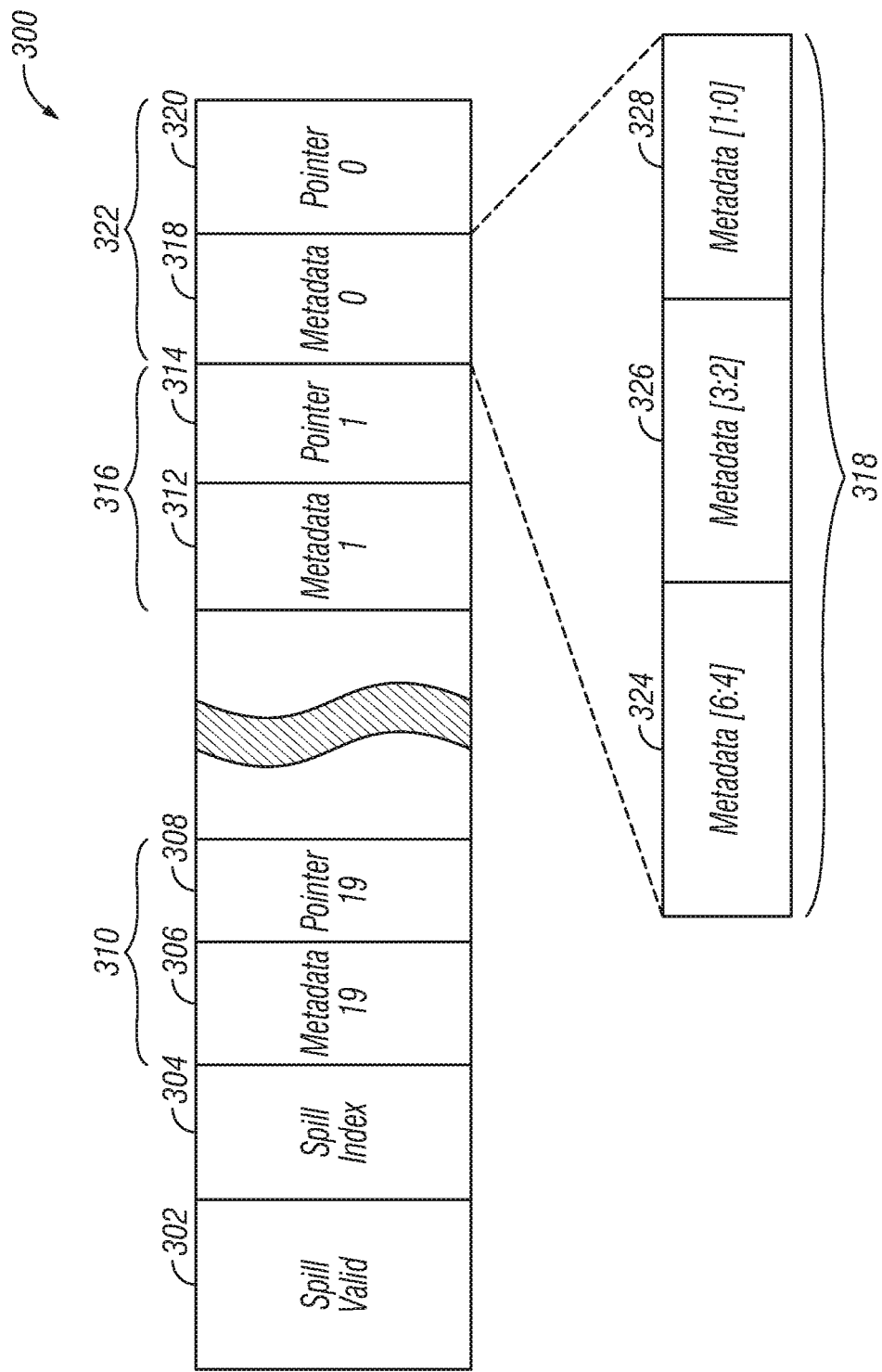
FIG. 3 is a block diagram illustrating a data compression logic unit, in accordance with embodiments of the present disclosure.

FIG. 3 is a block diagram that illustrates a hash table record 300 in accordance with embodiments of the present disclosure. A hash chain may include hash table record 300 and, optionally, one or more spill table records. Hash table record 300 may include fields related to the spill tables, as shown by 302 and 304, and fields related to the history buffer pointers, as shown by 306-322. The fields related to the spill tables may include a spill valid field 302 and a spill index field 304. Spill valid field 302 may be used to indicate whether the hash table record has overflowed or spilled into another table. Spill index field 304 may be used to index a spill table to locate overflow or spilled records. The overflow or spilled records may also include spill valid and spill index fields, in which case a plurality of overflow or spill records may be associated with a given hash table record. The fields related to the history buffer may include a plurality of pointer fields. For each pointer, there may be a field for storing the metadata and a field for storing the data pointer. In the illustrated example, the hash table record includes 20 pointers (0-19). Although 20 pointer fields are shown, any number of pointer fields comprising fields for storing metadata and data pointers may be used. Pointer 19 (310) may include a metadata field 306 and a data pointer field 308. Pointer 1 (316) may include a metadata field 312 and a data pointer field 314. Pointer 0 (322) may include a metadata field 318 and a data pointer field 320.

In some embodiments, for example, the metadata field may include one or more hints, each of which may correspond to a portion of the data in the history buffer. For example, the metadata 0 field may be 7-bits long. The two least significant bits of the metadata field, metadata 0 [1:0] (shown as 328), may store a hint for data with a minimum match length. The next two least significant bits of the metadata field, metadata 0 [3:2] (shown as 326), may store a hint for data with a length one byte more than the minimum match length. The three most significant bits of the metadata field, metadata 0 [6:4] (shown as 324), may store a hint for data with a length two bytes more than the minimum match length. Although three fields of two or three bits each are shown, the metadata field may include any number of bits and fields sufficient for data compression acceleration that is less than the total number of bits in the matching data.

The hints stored in metadata 318 may be generated from the data in the history buffer that is pointed to by the data pointer 320 in the hash table record 300. In some embodiments, the hints may be selected from the hash function for computing the hash index to the hash table. For minimum match length data, for example, the hint may be derived from a combination of the data bits in the hash function.

At initialization, all the pointers in a hash table record 300 and spill valid field 302 may be reset to a null or invalid state, such as 0. For each update of the hash table record 300 the data in the hash table record 300 may be shifted by one position to the left and pointer 0 (shown as 320) may be updated with the new pointer value. If there is no additional room in the hash table record 300, all pointers in the hash table record 300 may be written to an overflow or spill table (not shown), the spill valid field may be updated to a valid state, such as 1, and all pointers in the hash table record 300 may be reset to a null or invalid state. Subsequently, pointer 0 (320) may be updated with the new pointer value. The location in the spill table to which the hash table record 300 is written may be referenced using a spill index field 304. The spill table may contain spill table records. Each spill table record may include hash table record 300 and a hash table index. The hash table index may be used to determine whether the spill table record has been overwritten. If the spill table record has been overwritten, then an error may be signaled or raised.

Figure 4:
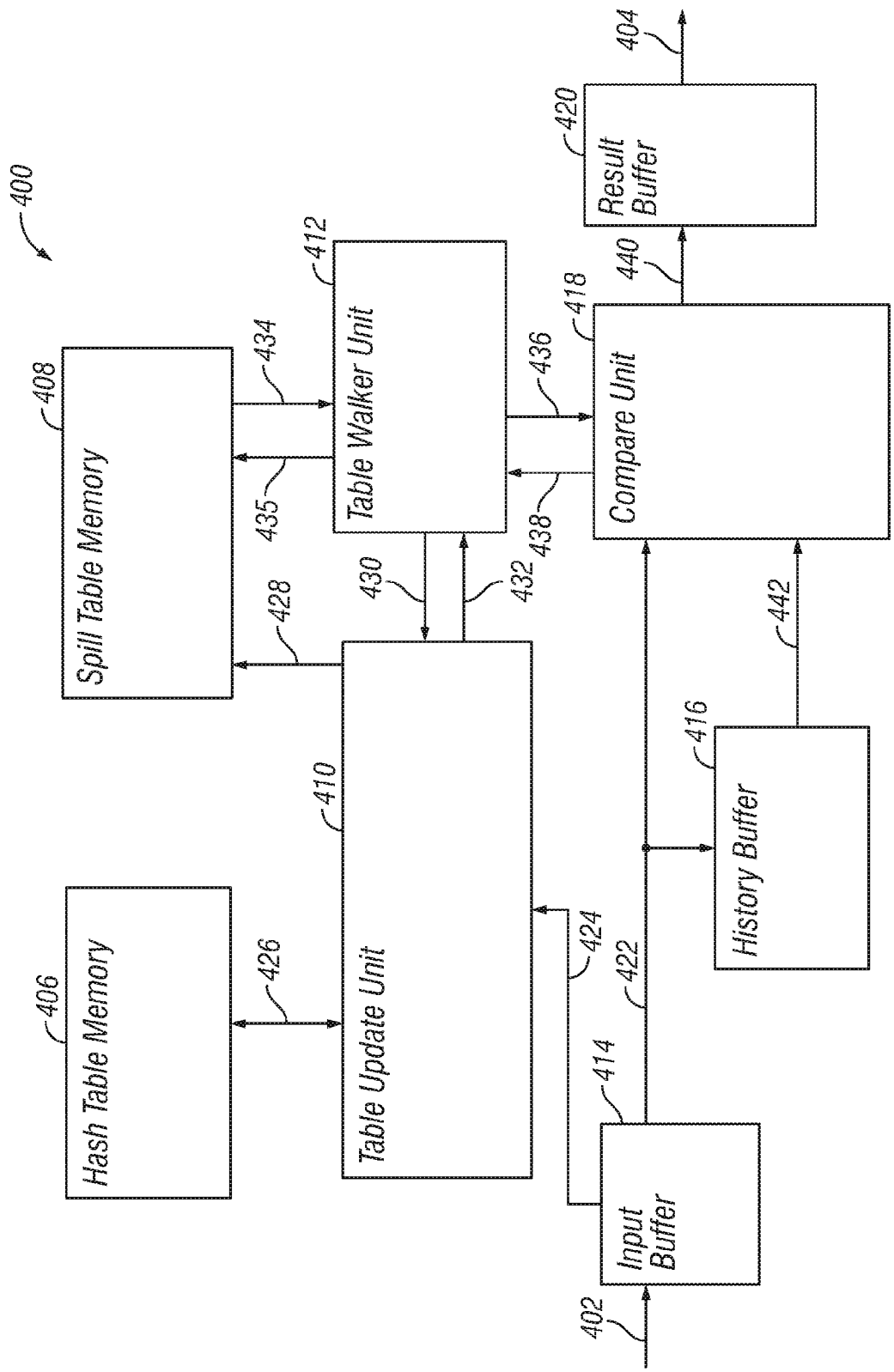
FIG. 4 is a block diagram illustrating a hash table record, in accordance with embodiments of the present disclosure.

FIG. 4 is a block diagram that illustrates a data compression logic unit 400, in accordance with embodiments of the present disclosure. Data compression logic unit 400 may implement data compression logic unit 230, in whole or in part. Data from an input data stream may be received at 402 and compressed data for an output data stream may be output at 404. The received data may be stored in an input buffer 414 and the resulting compressed data may be stored (shown by 440) in a result buffer 420 for output 404. Input buffer 414 may provide a byte offset 424 to table update unit 410. Input buffer 414 may provide input data 422 to compare unit 418 and history buffer 416. History buffer 416 may provide history data 442 to compare unit 418. Compare unit 418 may search for the longest matching data by comparing data from input buffer 414 with history buffer 416 using a current offset and one or more selected pointers provided via interface 436 from table walker unit 412. Compare unit 418 may provide information regarding the match length to table walker unit 412 via interface 438. The table walker unit 412 may use the match length information to adjust the position for walking due to table walker unit 412 and/or table update unit 410 being pipelined. The table walker unit 412 may proceed until a stop condition occurs. A stop condition may include there being no more pointers in the hash table record, receiving a "good enough" match from the compare unit 418, reaching the maximum number of pointers to process in a hash chain, or detecting an error in a spill table. The number of attempts to find a "good enough" matching data may be configured via any suitable mechanism, including but not limited to a hardware configuration register.

In some embodiments, data compression logic unit 400 may include more than one compare unit to identify a best matching data from parallel pipelines. If multiple compare units are implemented, the information regarding the match length that is provided to table walker unit 412 may be the longest match length between all compare units.

Table walker unit 412 may communicate with table update unit 410 via interfaces 430 and 432. For each byte position of the input data stream that may require input data searching of history buffer 416, table walker unit 412 may provide the current offset to table update unit 410 via interface 430. Table update unit 410 may flush data in a content addressable memory (CAM) that resides in a position less than the current offset 430. Since the longest match is the most desirable result, flushing data with a match length less than the current match length may ensure that resources are not wasted. If the CAM is empty, the CAM may refill with data.

In one embodiment, table update unit 410 may receive input data from an execution unit (not shown) for computing a hash index and metadata. In another embodiment, table update unit 410 may generate the hash index and metadata from the input data that may be indexed by byte offset 424. Table update unit 410 may communicate with hash table memory 406 via interface 426. Table update unit 410 may read or retrieve hash table records from hash table memory 406. For example, table update unit 410 may read from hash table memory 406 by providing a hash index for a read and receiving hash table read data in response. Table update unit 410 may perform updates to hash table records in hash table memory 406 for each byte position of the input data stream. For example, table update unit 410 may update hash table memory 406 by providing a hash index to identify the hash table record to write and the hash data to be written to the hash table record. In some embodiments, table update unit 410 may update data in spill table memory 408. For example, table update unit 410 may update spill table memory 408 by providing a spill table write index to identify the spill table entry to write and the spill table data to be written.

Figure 5:
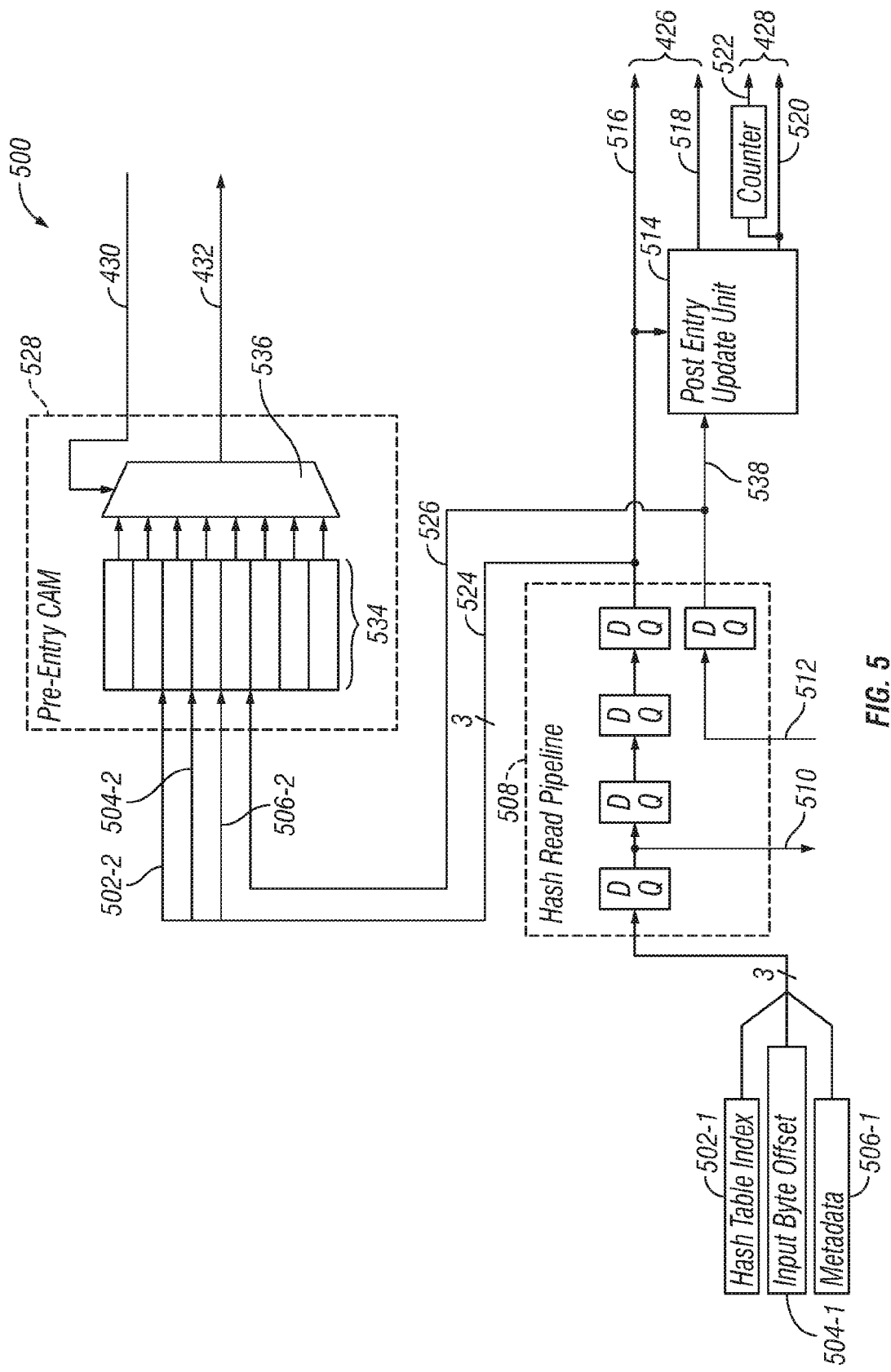
FIG. 5 is a block diagram illustrating a table update unit, in accordance with embodiments of the present disclosure.

FIG. 5 illustrates a block diagram of a table update unit 500 in accordance with embodiments of the present disclosure. Table update unit 500 may read a hash table record, provide the data read to the table walker unit, and update the hash table record and/or spill table record.

For an operation to read a hash table record, table update unit 500 may receive a hash index 502-1, an input byte offset 504-1, and metadata 506-1. Input byte offset 504-1 may provide the current offset into an input data stream, at least part of which may be stored in an input buffer. The offset may be used to index the input data stream to determine the current input for data compression processing. Hash index 502-1 may be a hash of at least a portion of the current input. For example, the portion may be one or more bits of a prefix of the current input.

Metadata 506-1 may be generated from the current input. Metadata 506-1 may include one or more hints to be used to accelerate data compression. Each hint may be based on a logical combination of one or more bits of the current input. For example, a hint may provide the logical AND of the even and odd numbered bits of the current input that would generate two bits for the hint, one for even-numbered bits and one for odd-numbered bits. As another example, a hint may provide the logical exclusive or (XOR) of a byte of the current input. The logic or circuitry for performing the logical combination for the hint may be separate from the logic or circuitry used to generate hash index 502-1. For example, the inputs to the logical combination for the hint may include more than the portion of the current input used to generate hash index 502-1. The inputs to the logical combination for the hint may correspond to a particular bit or byte in the current input, such as the third byte of the current input, or a set of bits or bytes in the current input, such as all bytes of the current input until and including the third byte of the current input.

The logical combination for the hint may be determined by analyzing one or more sets of data in a history buffer to determine what data is not accurately represented by the hash function or what bits or bytes are unique between data that have the same hash value. For example, two pieces of data with the same hash may share the same prefix data, but contain different data after the prefix data. The logical combination for the hint may include combinations of the prefix data and different data after the prefix data. Thus, two pieces of data may have the same hash, but have different hints.

In some embodiments, a hint may be associated with a particular match length for the current input. For example, a data compressor may be configured for a minimum match length of three bytes. The minimum match length may be selected based on the time and energy required to find a match or the amount of compression provided. The metadata may include a first hint corresponding to a minimum match length, a second hint corresponding to the minimum match length plus a first value, and a third hint corresponding to the minimum match length plus a second value. For example, the first value may be 1 and the second value may be 2. Although three hints are described, metadata 506-1 may include any suitable number of hints for performing data compression acceleration. Moreover, the hints may include any suitable number of bits for performing data compression acceleration.

Hash index 502-1, input byte offset 504-1, and metadata 506-1 may be provided to a hash read pipeline 508, which may include any suitable number of stages to allow a hash read to occur. For example, four stages are illustrated in FIG. 5 and each stage may include a D flip flop or latch. Each stage may correspond to one cycle of operation. In some embodiments, the hash table read index 510 may be generated after the first stage of hash read pipeline 508. Hash table read index 510 may index a hash table memory to provide a hash table record. The hash table may be part of a hash chain with hashes matching hash index 502-1. The hash table record may be received as pre-entry hash table read data 512 from a hash table memory in time for the fourth stage of hash read pipeline 508. Pre-entry hash table read data 512 may represent the hash table record before an update to the hash table record for the current input.

To provide data to a table walker unit, data may be provided to a pre-entry content addressable memory (CAM) 528. Hash read pipeline 508 may provide input data via 524, such as hash index 502-1, input byte offset 504-1, and/or metadata 506-1, and pre-entry hash table read data 512 via 526 to pre-entry CAM 528. The input data provided (shown as 524) may include hash index 502-2, input byte offset 504-2, and/or metadata 506-2 to pre-entry CAM 528. Data entries 534 in pre-entry CAM 528 may include the input byte offset 504-2, which may be for the index or address, pre-entry hash table read data 512, and metadata 506-2.

Current offset 430, which may be received from a table walker unit, may serve as an index into pre-entry CAM 528. In some embodiments, pre-entry CAM 528 may implement a multiplexer 536 for selecting a data entry based on current offset 430. Current offset 430 may specify the offset for the input data stream. Current offset 430 may be incremented by the table walker unit as successive portions of the input data stream are processed. In some embodiments, entries in pre-entry CAM 528 that are associated with an offset less than current offset 430 may be flushed from pre-entry CAM 528. Pre-entry CAM 528 may output the pre-entry hash table read data and the metadata for the current input (shown collectively as 432).

To update the hash table record, data may be provided to post-entry update unit 514. Hash read pipeline 508 may provide hash index hash write data 516 and hash read data 538 to post-entry update unit 514. Hash write data 516 may include hash index 502-1 and/or metadata 506-1.

Post-entry update unit 514 may make space for an additional entry. Post-entry update unit 514 may determine whether there is sufficient space in hash read data 538 to add an additional entry. Hash read data 538 may include a plurality of pointers. There may be sufficient space in hash read data 538 if one or more pointers are unused or null. If there is sufficient space in hash read data 538, post-entry update unit 514 may shift the pointers in hash read data 538 to the left by one position. If there is insufficient space in hash read data 538, post-entry update unit 514 may use a spill table, such as spill table memory 408. For example, post-entry update unit 514 may write the pointers and/or metadata in hash read data 538 to spill write data 520. Post-entry update unit 514 may set the value of a spill valid field in hash read data 538 to indicate that a spill table is being used. Post-entry update unit 514 may update spill table index 522, which may be incremented with a counter, and may output spill table index 522 for the spill table. A spill table may receive data 428 including spill write data 520 and spill table index 522, and update a spill table entry located at spill table index 522 with spill table data 520. Post-entry update unit 514 may invalidate or nullify the pointers and/or metadata in hash read data 538 in response to the data being written to a spill table.

If and when space for an additional entry in hash read data 538 in made, post-entry update unit 514 may insert an additional entry with a pointer to the data associated with hash index 502-1 into hash read data 538. The data may be located in a history buffer. Post-entry update unit 514 may insert metadata 506-1, which may be associated with the pointer, into hash read data 538. Post-entry update unit 514 may output hash write data 516 and post update hash read data 518 to a hash table memory, such as hash table memory 406. The hash table memory may receive data 426 including a hash table record and update the hash table record at a specified hash index.

Figure 6:
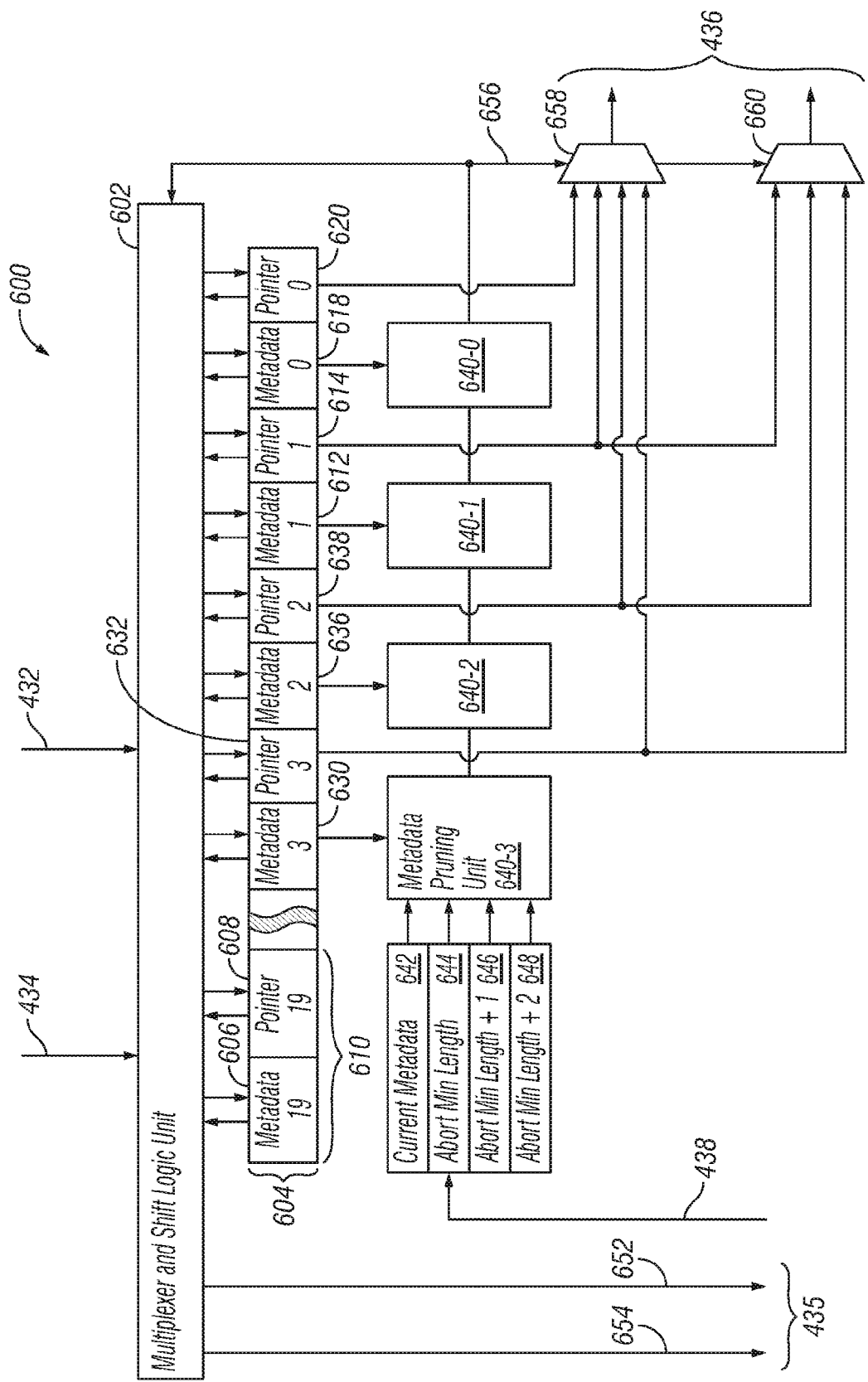
FIG. 6 is a block diagram illustrating a table walker unit, in accordance with embodiments of the present disclosure.

FIG. 6 illustrates a block diagram of a table walker unit 600 in accordance with embodiments of the present disclosure. Table walker unit 600 may be implemented by table walker unit 412, in whole or in part. A table walker unit 600 may include a multiplexer and shift logic unit 602 and a hash table record 604. Table walker unit 600 may send a request to a table update unit for each byte position of an input data stream in order to perform searches to find matching data in the history buffer. In response to the request from table walker unit 600, a table update unit may return the pre-entry hash read data, which may be a hash table record, and metadata for the current input 642. The pre-entry hash table read data may include metadata, which may be computed from the current byte position in the input data stream.

In connection with one or more compare units, table walker unit 600 may search for a match for the current input data. Table walker unit 600 may select a pointer from the hash chain, which may include hash table record 604. Table walker unit 600 may send the selected pointers to respective compare units, which may compare data in the history buffer with the current input data. The data in the history buffer may be identified using the selected pointer. The current input data may be specified by the current byte offset to the input data stream.

The table walker unit 600 may select pointers from the hash chain to produce a minimum match length. While producing a minimum match length, table walker unit 600 may mask one or more bits in the metadata, which may correspond to one or more fields for match lengths greater than the minimum match length, and may compare a portion of the metadata associated with the current input data with a portion of the metadata associated with the selected pointer. The masking may be performed by metadata pruning units 640. In some embodiments, there may be a separate metadata pruning units for each pointer in the hash table record (640-0, 640-1, 640-2, and 640-3) or may be a unified metadata pruning unit (not shown). The portion of the metadata, which may be associated with the current input data or the selected pointer, may correspond to the bits that are not masked. For example, the metadata may include a first hint, which may be two bits in length and may correspond to the minimum match length, a second hint, which may be two bits in length and may correspond to the match length one greater than the minimum match length, and a third hint, which may be three bits in length and may correspond to the match length two greater than the minimum match length. While the table walker unit attempts to find a minimum match length, the second hint and third hint may be masked from the comparison of metadata, in which the metadata associated with the current input is compared with the metadata associated with the selected pointer.

In some embodiments, table walker unit 600 may begin operation for a current byte offset by selecting a pointer at one end of the hash chain. For example, pointer 0 (620) may be selected, and the pointers and metadata in the hash table record may be processed before proceeding to process spill table entries in the hash chain.

For example, metadata 618 and pointer 620 may be processed first, metadata 612 and pointer 614 may be processed second, metadata 636 and pointer 638 may be processed third, metadata 630 and pointer 632 may be processed fourth, and so on until metadata 606 and pointer 608 may be processed last in the hash table record. After all the pointers in the hash table record are processed, one or more pointers in a spill table may be processed. In some embodiments, table walker unit 600 may begin operation for a current byte offset by selecting a pointer from a spill table entry if there are no valid or non-null pointers in the hash table record. Table walker unit 600 may evaluate the spill table valid field for the hash table record to determine if one or more spill table entries are in the hash chain. If the spill table valid field for the hash table record is set, table walker unit 600 may send a request 435 for data from the spill table. Request 435 may include a spill table read command 652 and a spill table index 654. In response, the spill table may return the spill table read data 434. The hash chain may be hundreds of entries in length, in which spill table read data 434 may refer to other spill table records.

Table walker unit 600 may compare the metadata for a predefined number of pointers in parallel, or may compare the metadata for one pointer at a time. For each selected pointer, table walker unit 600 may mask a portion of the metadata not associated with the current match length. The mask may be applied to the metadata for the selected pointer and the current input data. The mask may be applied once to the current input data for all selected pointers. Table walker unit 600 may compare the portion of the metadata of the current input data and the selected pointer that was not masked. If the portion of the metadata matches, the selected pointer may be considered a good candidate for performing a comparison of the actual data. If the portion of the metadata does not match, table walker unit 600 may filter the selected pointer from the comparison in a compare unit. Metadata pruning units 640 may filter the candidates that are not "good" by using selector 656, which may select pointers 436 for the compare unit(s).

Table walker unit 600 may continue processing selected pointers until a stop condition occurs. The stop condition may include any suitable event corresponding to a match or an error. For example, the stop condition may correspond to a hash table record in which there is an invalid or null pointer and the spill table valid field is not set. As another example, the stop condition may correspond to a compare unit sending an indication to the table walker unit 600. To inform table walker unit 600 that a "good enough" match has been found for the current input data in the input data stream. In at least one embodiment, a "good enough" match corresponds to a match of a minimum length, such as a minimum length of three bytes. The minimum match length may be configurable via a control register for a data compression logic unit, or some other suitable mechanism to configure table walker unit 600. In another example, the stop condition may correspond to table walker unit 600 reaching a maximum number of pointers to process in the hash chain, which may be configurable. In yet another example, the stop condition may correspond to table walker unit 600 detecting an error in the spill table, such as detecting that the distance of the selected pointer exceeding the size of the history buffer or detecting that the record in the spill table has been overwritten.

While the table walker unit 600 is processing selected pointers, the compare unit may send a message 438 to table walker unit 600, which may indicate that the length of the best data match found for the current input data in the input data stream. In response, table walker unit 600 may adjust the filtering of selected pointers by unmasking one or more metadata bits, or by no longer masking one or more metadata bits. For example, the compare unit may find data matching a minimum length and may send a message to table walker unit 600. The message may indicate that table walker unit 600 should abort minimum length candidates 644. In response, table walker unit 600 may begin comparing metadata bits corresponding to a match length that is one greater than the minimum length (i.e., minimum length+1). Although an increment of one is described, the increment may be any suitable value. Accordingly, table walker unit 600 may filter additional selected pointers. Table walker unit 600 may compare a portion of the metadata of the selected pointer with a portion of the metadata of the current input data. The portion may include one or more bits corresponding to the minimum match length+1. In some embodiments, the portion may further include one or more bits corresponding to the minimum match length. Thus, table walker unit 600 may filter selected pointers that are determined to only produce data matching the minimum length or less. As another example, the compare unit may find data matching the minimum match length+1, and may send a message 438 to table walker unit 600. The message may indicate that table walker unit 600 should abort minimum length+1 candidates 646 and not abort minimum length+2 candidates 648. In response, table walker unit 600 may begin comparing metadata bits corresponding to a match length two greater than the minimum length (i.e., minimum length+2). Although an increment of one is described for minimum length+1 and minimum length+2, the increment may be any suitable value, which may skip some match lengths, and may be unique for each portion of the metadata. Accordingly, table walker unit 600 may filter additional selected pointers by comparing all of the metadata of the selected pointer with all of the metadata of the current input data. The metadata may include a first portion or hint for the minimum match length, a second hint for the minimum length+1, and a third hint for the minimum length+2. Thus, table walker unit 600 may filter selected pointers that are determined to only produce data matching the minimum length+1, or less. The compare unit may send a message 438 for any suitable match length and table walker unit 600 may adjust the filtering of selected pointers based on any suitable match length.

Figure 7:
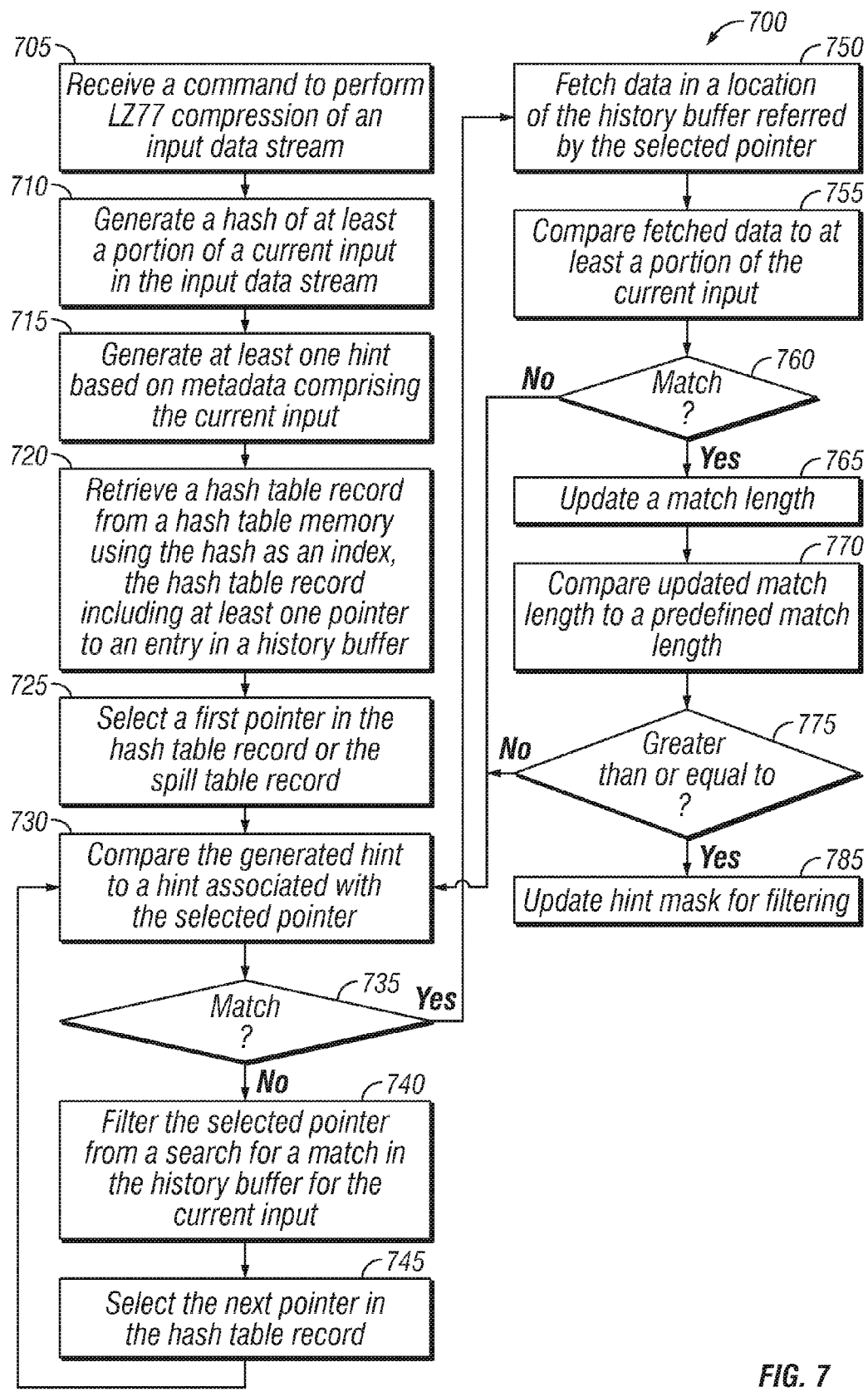
FIG. 7 is a flow chart illustrating a method for accelerating compression with hints and filtering, in accordance with embodiments of the present disclosure.

FIG. 7 illustrates an example method 700 for data compression acceleration based on hints and filtering, according to embodiments of the present disclosure. Method 700 may be implemented by any of the elements shown in FIG. 1-6 or 8-15. Method 700 may be initiated by any suitable criteria and may initiate operation at any suitable point. In one embodiment, method 700 may initiate operation at 705. Method 700 may include greater or fewer operations than those illustrated. Moreover, method 700 may execute its operations in an order different than those illustrated. Method 700 may terminate at any suitable operation. Moreover, method 700 may repeat operation at any suitable point. Method 700 may perform any of its operations in parallel with other operations of method 700, or in parallel with operations of other methods.

At 705, a command to perform compression of an input data stream using an LZ77 algorithm may be received. In some embodiments, the command may be an instruction, which may be decoded by a processor or core and dispatched to a data compression logic unit. In other embodiments, the command may be generated by software and a processor may direct or offload LZ77 compression to a data compression logic unit.

At 710, a hash value of a current input in the input data stream may be generated. The hash value may be the output of a hash function. The hash value may be any suitable representation of at least a portion of the current input. The current input may be a portion of the input data stream that is indexed using a current byte offset. In one embodiment, the current input may be one byte in length and the hash function may be performed on a portion of the input data stream that is at least a minimum length, such as one byte. In another embodiment, the current input may be multiple bytes in length and the hash function may be performed on at least a portion of the current input, such as at least a byte of the current input or a prefix of the current input.

At 715, metadata comprising at least one hint may be generated. The hint may be based on the current input or on one or more bytes of the input data stream. The hint may be generated by a logical combination of one or more bits of the input data stream. In some embodiments, only one hint corresponding to the minimum match length may be generated. In other embodiments, a plurality of hints corresponding to a plurality of match lengths may be generated.

At 720, a hash table record from a hash table memory may be retrieved using the hash as an index into the hash table memory. The hash table record may include at least one pointer to an entry in a history buffer. The history buffer may represent recently compressed data. The compressed data may be used to compress the current input.

At 725, a first pointer in the hash table record may be selected. If the first pointer in the hash table record is invalid or null and a spill table field in the hash table record is set, a spill table record may be retrieved and the first pointer in the spill table record may be selected instead of a pointer in a hash table record.

At 730, the generated hint may be compared to a hint associated with the selected pointer. In some embodiments, a plurality of hints may have been generated, and each hint may correspond to a defined match length. In some embodiments, the comparison may be performed after one or more hints have been masked from the data to compare. For example, the comparison may begin with the minimum match length and all hints others than the hint that corresponds to the minimum match length may be masked from the comparison.

At 735, it may be determined whether there is a match between at least one generated hint and one hint associated with the selected pointer. The match may be based on which hints are previously generated or masked. For example, if a hint is masked from the comparison, the hint may not need to match. If there is a match, method 700 may proceed to 750. If there is not a match, method 700 may proceed to 740.

At 740, the selected pointer may be filtered from a search for a match in the history buffer for the current input. The selected pointer may be filtered out because it would not result in a match for the minimum match length or the current best match length. One or more compare units may provide a table walker unit an indication of the current best match length. At 745, the next pointer may be selected in the hash table record or the spill table record. Method 700 may proceed to 730 until a stop condition occurs. In one embodiment, the stop condition may include there being no more pointers in the hash table record. In another embodiment, the stop condition may include receiving a "good enough" match from one or more compare units. In a further embodiment, the stop condition may include reaching the maximum number of pointers to process in a hash chain. In yet another embodiment, the stop condition may include detecting an error in a spill table.

At 750, the data in a location of the history buffer may be fetched. The location of the data may be identified or referenced by the selected pointer. At 755, the fetched data may be compared to at least a portion of the current input. For example, the fetched data may be one byte in length and the current input may be two bytes in length, and the comparison may be between the fetched data and one byte of the current input. At 760, it may be determined whether there is a match based on the comparison. If there is no match, method 700 may proceed to 745. If there is a match, method 700 may proceed to 765. At 765, the match length or length of the match may be updated. A table walker unit may receive the best current match length from one or more compare units that are comparing data in the history buffer to the current input. If a plurality of compare units send a match length, the table walker unit, or any suitable logic or circuitry, may determine the maximum match length among the plurality of compare units. At 770, the updated match length may be compared to a predefined match length. At 775, if the updated match length, which may be referred to as the best match length, is greater than or equal to the predefined match length, method 700 may proceed to 785. Otherwise, method 700 may proceed to 730. At 785, another generated hint may be used for filtering by updating the mask of the generated hints. The other hint may be associated with a second match length and the first hint may be associated with a first match length. In one embodiment, the second match length may be one greater than the first match length. In another embodiment, the second match length may skip or refrain from using one or more match lengths and may be greater than the first match length by two or more. The other hint may be used by no longer masking the hint from the comparison at 730. If the updated match length is greater than or equal to a predefined match length, it may be determined that a "good enough" match is found. Method 700 may repeat or terminate.

The figures described below include detailed examples of architectures and systems to implement embodiments of the hardware components and/or instructions described above. In some embodiments, one or more hardware components and/or instructions described above may be emulated as described in detail below, or may be implemented as software modules.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, exemplary systems, architectures, and pipelines are detailed below. Embodiments of the instruction(s) above may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Example Core Architectures, Processors, and Computer Architectures

Processor cores may be implemented in different ways, for different purposes, and in different processors. For instance, in various embodiments, such cores may include a general purpose in-order core intended for general-purpose computing, a high-performance general purpose out-of-order core intended for general-purpose computing, and/or a special purpose core intended primarily for graphics and/or scientific computing (e.g., high throughput computing). In various embodiments, different processors may include a CPU, including one or more general purpose in-order cores intended for general-purpose computing and/or one or more general purpose out-of-order cores intended for general-purpose computing, and a coprocessor, including one or more special purpose cores intended primarily for graphics and/or scientific computing (e.g., high throughput computing). Such different processors may lead to different computer system architectures, in different embodiments. For example, in some embodiments, a coprocessor may be on a separate chip than a CPU. In other embodiments, a coprocessor may be on a separate die than a CPU, but may be in the same package as the CPU. In some embodiments, a coprocessor may be on the same die as a CPU. In this case, the coprocessor may sometimes be referred to as special purpose logic, which may include integrated graphics and/or scientific logic (e.g., high throughput logic), or as a special purpose core. In some embodiments, a system on a chip may include, on the same die, a CPU as described above (which may be referred to as the application core(s) or application processor(s)), a coprocessor as described above, and additional functionality. Example core architectures, processors, and computer architectures are described below, according to some embodiments.

Example Core Architectures
In-Order and Out-of-Order Core Block Diagram

Figure 8A:
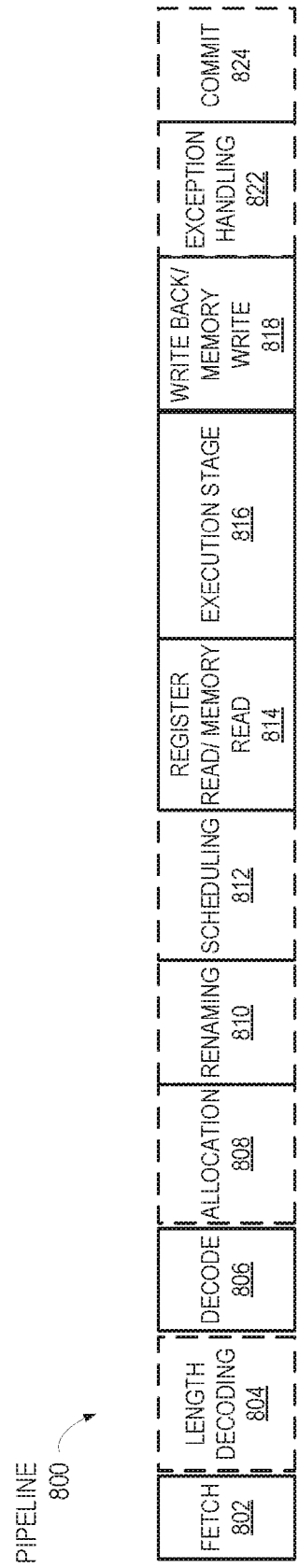
FIG. 8A is a block diagram illustrating both an exemplary in-order pipeline and an exemplary register renaming, out-of-order issue/execution pipeline according to embodiments of the invention.
Figure 8B:
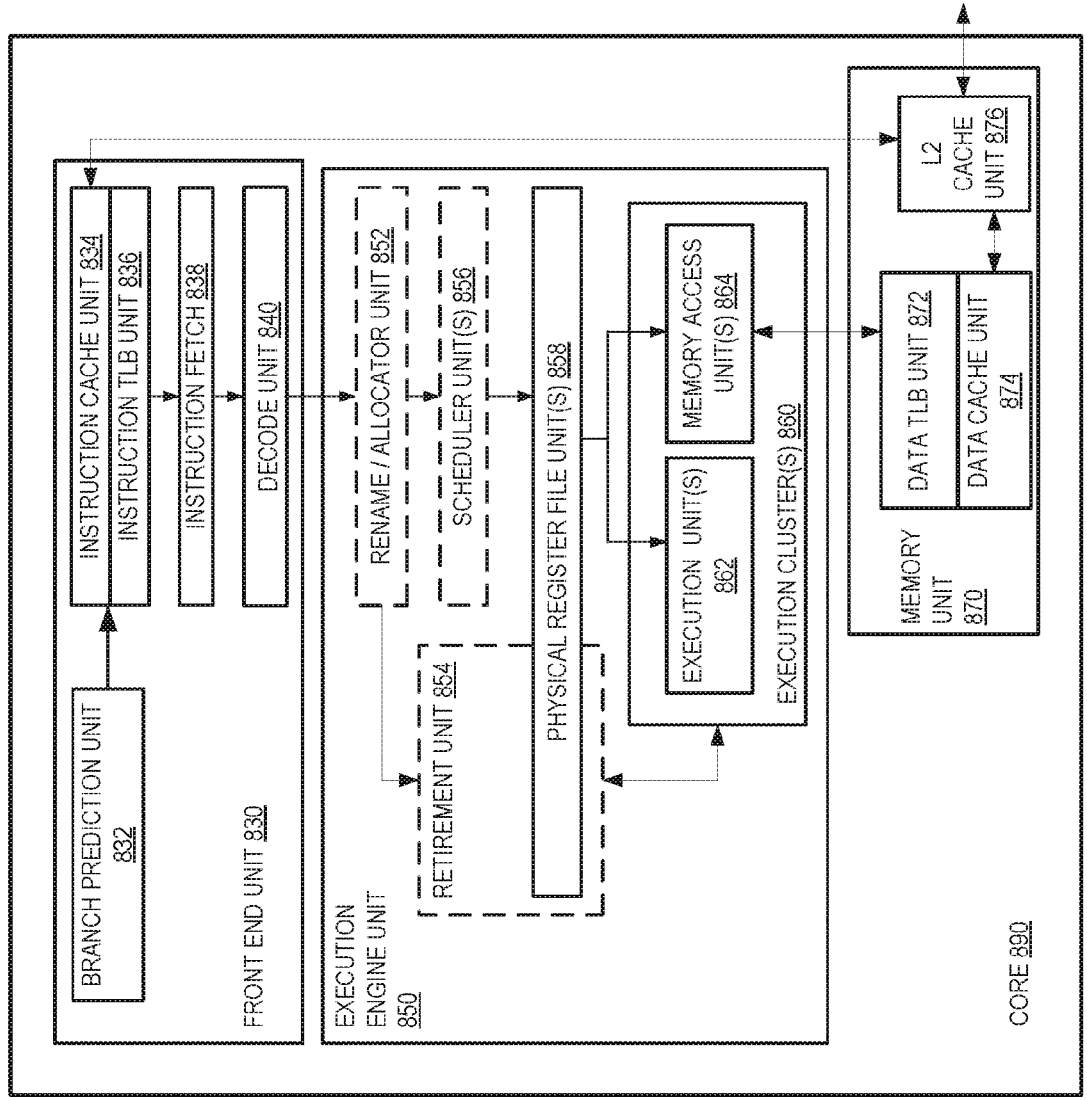
FIG. 8B is a block diagram illustrating both an exemplary embodiment of an in-order architecture core and an exemplary register renaming, out-of-order issue/execution architecture core to be included in a processor according to embodiments of the invention.

FIG. 8A is a block diagram illustrating an example in-order pipeline and a register renaming, out-of-order issue/execution pipeline, according to some embodiments. FIG. 8B is a block diagram illustrating an in-order architecture core and register renaming, out-of-order issue/execution logic to be included in a processor, according to some embodiments. The solid lined boxes in FIG. 8A illustrate the in-order pipeline, while the dashed lined boxes illustrate the register renaming, out-of-order issue/execution pipeline. Similarly, the solid lined boxes in FIG. 8B illustrate the in-order architecture logic, while the dashed lined boxes illustrate the register renaming logic and out-of-order issue/execution logic In FIG. 8A, a processor pipeline 800 includes a fetch stage 802, a length decoding stage 804, a decode stage 806, an allocation stage 808, a renaming stage 810, a scheduling stage 812 (also known as a dispatch or issue stage), a register read/memory read stage 814, an execution stage 816, a write back/memory write stage 818, an exception handling stage 822, and a commit stage 824.

In FIG. 8B, arrows denote a coupling between two or more units and the direction of the arrow indicates a direction of data flow between those units. In this example, FIG. 8B illustrates a processor core 890 including a front end unit 830 coupled to an execution engine unit 850, both of which may be coupled to a memory unit 870. The core 890 may be a reduced instruction set computing (RISC) core, a complex instruction set computing (CISC) core, a very long instruction word (VLIW) core, or a core of a hybrid or alternative core type, in different embodiments. In various embodiments, core 890 may be a special-purpose core, such as, for example, a network core, a communication core, a compression engine, a coprocessor core, a general-purpose computing graphics processing unit (GPGPU) core, a graphics core, or another type of special-purpose core.

In this example, front end unit 830 includes a branch prediction unit 832 coupled to an instruction cache unit 834. Instruction cache unit 834 may be coupled to an instruction translation lookaside buffer (TLB) 836. TLB 836 may be coupled to an instruction fetch unit 838, which may be coupled to a decode unit 840. Decode unit 840 may decode instructions, and may generate as an output one or more micro-operations, micro-code entry points, microinstructions, other instructions, or other control signals, which are decoded from, or which otherwise reflect, or are derived from, the original undecoded instructions. Decode unit 840 may be implemented using any of a variety of suitable mechanisms, in different embodiments. Examples of suitable mechanisms may include, but are not limited to, look-up tables, hardware circuitry, programmable logic arrays (PLAs), microcode read only memories (ROMs). In one embodiment, instruction cache unit 834 may be further coupled to a level 2 (L2) cache unit 876 in memory unit 870. In one embodiment, the core 890 may include a microcode ROM or other medium that stores microcode for certain macroinstructions (e.g., within decode unit 840 or elsewhere within the front end unit 830). The decode unit 840 may be coupled to a rename/allocator unit 852 within the execution engine unit 850.

In this example, execution engine unit 850 includes the rename/allocator unit 852, which may be coupled to a retirement unit 854 and a set of one or more scheduler unit(s) 856. Scheduler unit(s) 856 may represent any number of different schedulers of various types, including those that implement reservations stations or those that implement a central instruction window. As illustrated in this example, scheduler unit(s) 856 may be coupled to physical register file unit(s) 858. Each of the physical register file units 858 may represent one or more physical register files, different ones of which store data of one or more different data types including, but not limited to, scalar integer, scalar floating point, packed integer, packed floating point, vector integer, vector floating point, or status data types. One example of the use of a status data type may be an instruction pointer that indicates the address of the next instruction to be executed. In one embodiment, a physical register file unit 858 may include a vector register unit, a write mask register unit, and a scalar register unit (not shown). These register units may provide architectural vector registers, write mask registers (e.g., vector mask registers), and general-purpose registers.

In FIG. 8B, the physical register file unit(s) 858 are shown as being overlapped by the retirement unit 854 to illustrate various ways in which register renaming and out-of-order execution may be implemented. For example, in different embodiments, register renaming and out-of-order execution may be implemented using one or more reorder buffers and one or more retirement register files; using one or more future files, one or more history buffers, and one or more retirement register files; or using register maps and a pool of registers. In general, the architectural registers may be visible from the outside of the processor and/or from a programmer's perspective. The registers are not limited to any particular known type of circuit. Rather, any of a variety of different types of registers may be suitable for inclusion in core 890 as long as they store and provide data as described herein. Examples of suitable registers include, but are not limited to, dedicated physical registers, dynamically allocated physical registers using register renaming, and combinations of dedicated and dynamically allocated physical registers. In the example illustrated in FIG. 8B, retirement unit 854 and physical register file unit(s) 858 are coupled to the execution cluster(s) 860. Each of execution clusters 860 may include a set of one or more execution units 862 and a set of one or more memory access units 864. Execution units 862 may perform various operations (e.g., shifts, addition, subtraction, multiplication) and may operate on various types of data (e.g., scalar floating point, packed integer, packed floating point, vector integer, vector floating point). While some embodiments may include a number of execution units dedicated to specific functions or sets of functions, other embodiments may include only one execution unit, or may include multiple execution units all of which perform all supported functions or operations. In the example illustrated in FIG. 8B, scheduler unit(s) 856, physical register file unit(s) 858, and execution cluster(s) 860 are shown as potentially including a plurality of such units since some embodiments include separate pipelines for certain types of data/operations. For example, some embodiments may include a scalar integer pipeline, a scalar floating point/packed integer/packed floating point/vector integer/ vector floating point pipeline, and/or a memory access pipeline, each of which includes its own scheduler unit, physical register file unit, and/or execution cluster. In some embodiments that include a separate memory access pipeline, only the execution cluster of this pipeline includes a memory access unit 864. It should also be understood that where separate pipelines are used, one or more of these pipelines may be out-of-order issue/execution pipelines and the rest may be in-order execution pipelines.

In the example illustrated in FIG. 8B, the set of memory access units 864 may be coupled to the memory unit 870, which includes a data TLB unit 872. Data TLB unit 872 may be coupled to a data cache unit 874, which in turn may be coupled to a level 2 (L2) cache unit 876. In one example embodiment, the memory access units 864 may include a load unit, a store address unit, and a store data unit, each of which may be coupled to the data TLB unit 872 in the memory unit 870. The L2 cache unit 876 may be coupled to one or more other levels of cache and, eventually, to a main memory. While FIG. 8B illustrates an embodiment in which instruction cache unit 834, data cache unit 874, and level 2 (L2) cache unit 876 reside within core 890, in other embodiments one or more caches or cache units may be internal to a core, external to a core, or apportioned internal to and external to a core in different combinations.

In one example embodiment, the register renaming, out-of-order issue/execution core architecture illustrated in FIG. 8B may implement pipeline 800 illustrated in FIG. 8B as follows. The instruction fetch unit 838 may perform the functions of the fetch and length decoding stages 802 and 804. The decode unit 840 may perform the functions of decode stage 806. The rename/allocator unit 852 may perform the functions of the allocation stage 808 and the renaming stage 810. The scheduler unit(s) 856 may perform the functions of the scheduling stage 812. The physical register file unit(s) 858 and the memory unit 870 may, collectively, perform the functions of the register read/ memory read stage 814. The execution cluster(s) 860 may perform the functions of the execution stage 816. The memory unit 870 and the physical register file unit(s) 858 may, collectively, perform the functions of the write back/ memory write stage 818. In different embodiments, various units (some of which may not be shown) may be involved in performing the functions of the exception handling stage 822. The retirement unit 854 and the physical register file unit(s) 858 may, collectively, perform the functions of the commit stage 824.

In different embodiments, core 890 may support one or more instructions sets, including the instruction(s) described herein. For example, in various embodiments, core 890 may support the x86 instruction set (with or without extensions that have been included in recent versions); the MIPS instruction set of MIPS Technologies of Sunnyvale, Calif.; and/or the ARM instruction set of ARM Holdings of Sunnyvale, Calif. (with or without optional additional extensions such as NEON. In one embodiment, core 890 may include logic to support a packed data instruction set extension (e.g., AVX1 or AVX2), thereby allowing the operations used by many multimedia applications to be performed using packed data.

In some embodiments, core 890 may support multithreading (e.g., executing two or more parallel sets of operations or threads), and may do so in a variety of ways. Core 890 may, for example, include support for time sliced multithreading, simultaneous multithreading (in which a single physical core provides a logical core for each of the threads that the physical core is simultaneously executing), or a combination of time sliced and simultaneous multithreading. In one embodiment, for example, core 890 may include support for time sliced fetching and decoding, and for simultaneous multithreading in subsequent pipeline stages, such as in the Intel® Hyperthreading technology.

While register renaming is described herein in the context of out-of-order execution, it should be understood that register renaming may be used in an in-order architecture, in some embodiments. While in the example embodiment illustrated in FIG. 8B, core 890 includes separate instruction and data cache units 834 and 874, respectively, and a shared L2 cache unit 876, in other embodiments core 890 may include a single internal cache for both instructions and data, such as, for example, a Level 1 (L1) internal cache, or multiple levels of internal cache. In some embodiments, the system may include a combination of an internal cache and an external cache (e.g., a cache that is external to the core and/or the processor). In other embodiments, all of the caches may be external to the core and/or the processor.

Specific Example In-Order Core Architecture

Figure 9B:
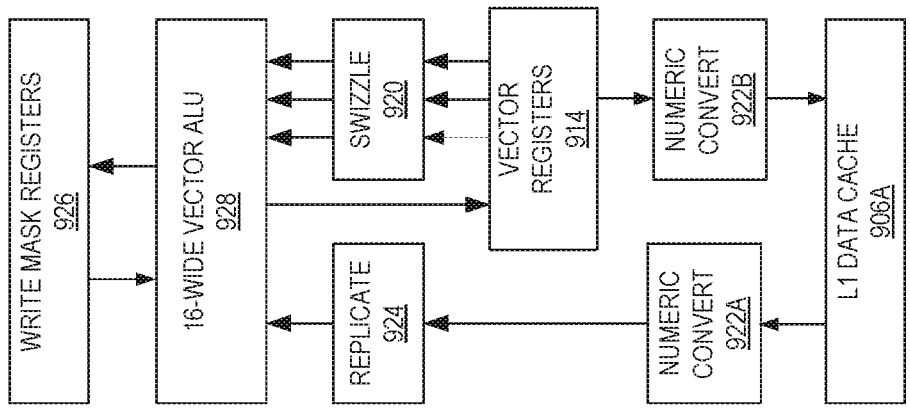
FIGS. 9A-B illustrate a block diagram of a more specific exemplary in-order core architecture, which core would be one of several logic blocks (including other cores of the same type and/or different types) in a chip.
Figure 9A:
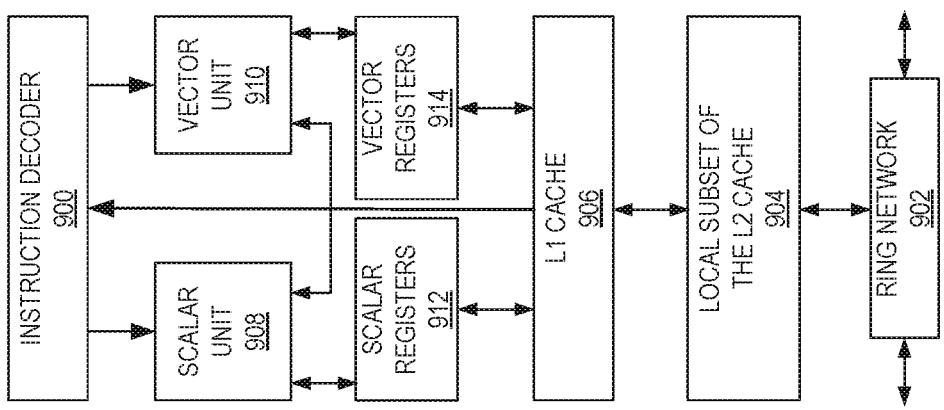

FIGS. 9A and 9B are block diagrams illustrating a more specific example of an in-order core architecture in which a core may be one of several logic blocks (including, for example, other cores of the same type and/or of different types) in a chip. As illustrated in this example, the logic blocks may communicate through a high-bandwidth, on-die interconnect network (e.g., a ring network) with some fixed function logic, memory I/O interfaces, and other necessary I/O logic, depending on the application.

FIG. 9A is a block diagram illustrating a single processor core, along with its connections to an on-die interconnect network (shown as ring network 902) and to its local subset of a Level 2 (L2) cache 904, according to some embodiments. In one embodiment, an instruction decoder 900 may support the x86 instruction set with a packed data instruction set extension. An L1 cache 906 may allow low-latency accesses to cache memory by the scalar and vector units. In one embodiment (e.g., to simplify the design), a scalar unit 908 and a vector unit 910 may use separate register sets (e.g., scalar registers 912 and vector registers 914, respectively) and data that is transferred between them may be written to memory and then read back in from level 1 (L1) cache 906.

However, other embodiments may use a different approach. For example, they may include a single register set or may include a communication path that allows data to be transferred between the two register files without being written to memory and read back.

In this example, the local subset of the L2 cache 904 may be part of a global L2 cache that is divided into separate local subsets, e.g., with one subset per processor core. Each processor core may have a direct access path to its own local subset of the L2 cache 904. Data read by a processor core may be stored in its L2 cache subset 904 from which it can be accessed quickly and in parallel with accesses by other processor cores to their own local L2 cache subsets. Data written by a processor core and stored in its own L2 cache subset 904 may be flushed from other L2 cache subsets, if necessary. In some embodiments, the ring network 902 may ensure coherency for shared data. The ring network may be bi-directional to allow agents such as processor cores, L2 caches and other logic blocks to communicate with each other within the chip. In one embodiment, each ring datapath may be 1012 bits wide per direction.

FIG. 9B illustrates an expanded view of part of the processor core illustrated in FIG. 9A, according to some embodiments. In this example, FIG. 9B includes an L1 data cache 906A, which may be part of the L1 cache 904, as well as more detail regarding the vector unit 910 and the vector registers 914. Specifically, the vector unit 910 may be a 16-wide vector processing unit (VPU) that includes a 16-wide vector ALU 928. ALU 928 may be configured to execute one or more of integer, single-precision float, and double-precision float instructions. The VPU may also support swizzling the register inputs (using swizzle unit 920), numeric conversion (using numeric convert units 922A and 922B), and replication (using replication unit 924) on the memory input. The inclusion of write mask registers 926 may allow for predicating resulting vector writes.

Figure 10:
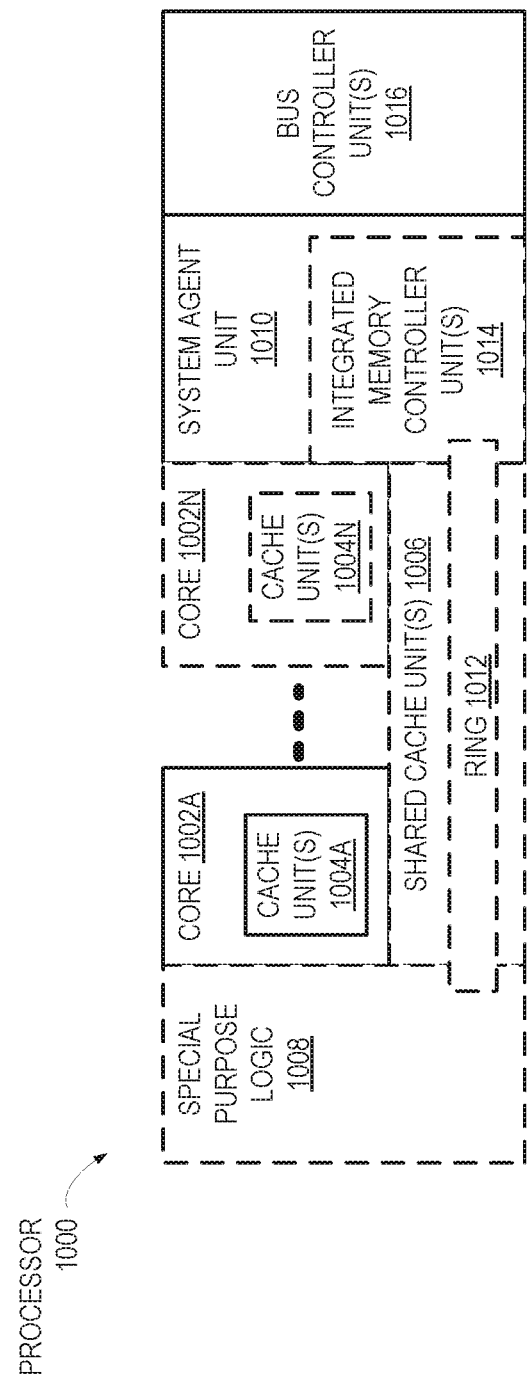
FIG. 10 is a block diagram of a processor that may have more than one core, may have an integrated memory controller, and may have integrated graphics according to embodiments of the invention.

FIG. 10 is a block diagram illustrating a processor 1000 that may, in some embodiments, include more than one core, an integrated memory controller, and/or may special purpose logic (such as for integrated graphics computing). The solid lined boxes in FIG. 10 illustrate a processor 1000 that includes a single core 1002A, a system agent 1010, and a set of one or more bus controller units 1016. With the optional addition of the dashed lined boxes, an alternative embodiment of processor 1000 includes multiple cores 1002A-1002N, and also includes a set of one or more integrated memory controller unit(s) 1014 within the system agent unit 1010, and special purpose logic 1008. In some embodiments, one or more of cores 1002A-1002N may be similar to processor core 890 illustrated in FIG. 8B or the processor core illustrated in FIGS. 9A and 9B.

In some embodiments, processor 1000 may represent a CPU in which the special purpose logic 1008 includes integrated graphics and/or scientific logic (which may include one or more cores), and in which the cores 1002A-1002N include one or more general purpose cores (e.g., general purpose in-order cores, general purpose out-of-order cores, or a combination of the two). In other embodiments, processor 1000 may represent a coprocessor in which the cores 1002A-1002N include a large number of special purpose cores intended primarily for graphics and/or scientific computing (e.g., high throughput computing). In still other embodiments, processor 1000 may represent a coprocessor in which the cores 1002A-1002N include a large number of general purpose in-order cores. Thus, in different embodiments, the processor 1000 may be a general purpose processor, a coprocessor, or a special purpose processor, such as, for example, a network or communication processor, compression engine, graphics processor, GPGPU (general purpose graphics processing unit), a high-throughput "many integrated core" (MIC) coprocessor (including, for example, 30 or more cores), an embedded processor, or another type of processor. The processor 1000 may be implemented on one chip or on more than one chip, in different embodiments. The processor 1000 may be a part of and/or may be implemented on one or more substrates using any of a number of process technologies, such as, for example, BiCMOS, CMOS, or NMOS.

In the example illustrated in FIG. 10, the memory hierarchy includes one or more levels of cache within each of the cores 1002A-1002N, shown as cache units 1004A-1004N, a set of one or more shared cache units 1006, and external memory (not shown), some or all of which are coupled to the set of integrated memory controller units 1014. The set of shared cache units 1006 may include one or more mid-level caches, such as level 2 (L2) cache, a level 3 (L3) cache, a level 4 (L4) cache, other levels of cache, a last level cache (LLC), and/or combinations thereof. In one embodiment, a ring based interconnect unit 1012 may be used to interconnect the special purpose logic 1008 (which may include integrated graphics logic), the set of shared cache units 1006, and the system agent unit 1010/integrated memory controller unit(s) 1014. In other embodiments, any number of other suitable techniques may be used for interconnecting such units. In one embodiment, coherency may be maintained between one or more cache units 1006 and cores 1002A-1002N.

In some embodiments, one or more of the cores 1002A-1002N may be capable of multithreading. In some embodiments, the system agent 1010 may include circuitry or logic for coordinating and operating cores 1002A-1002N. For example, the system agent unit 1010 may include a power control unit (PCU) and a display unit. The PCU may be or include logic and circuitry for regulating the power state of the cores 1002A-1002N and the special purpose logic 1008 (which may include integrated graphics logic). The display unit may include circuitry or logic for driving one or more externally connected displays.

In various embodiments, the cores 1002A-1002N may be homogenous or heterogeneous in terms of architecture instruction set. That is, two or more of the cores 1002A-1002N may be capable of executing the same instruction set, while others may be capable of executing only a subset of that instruction set or may execute a different instruction set.

Example Computer Architectures

Figure 11:
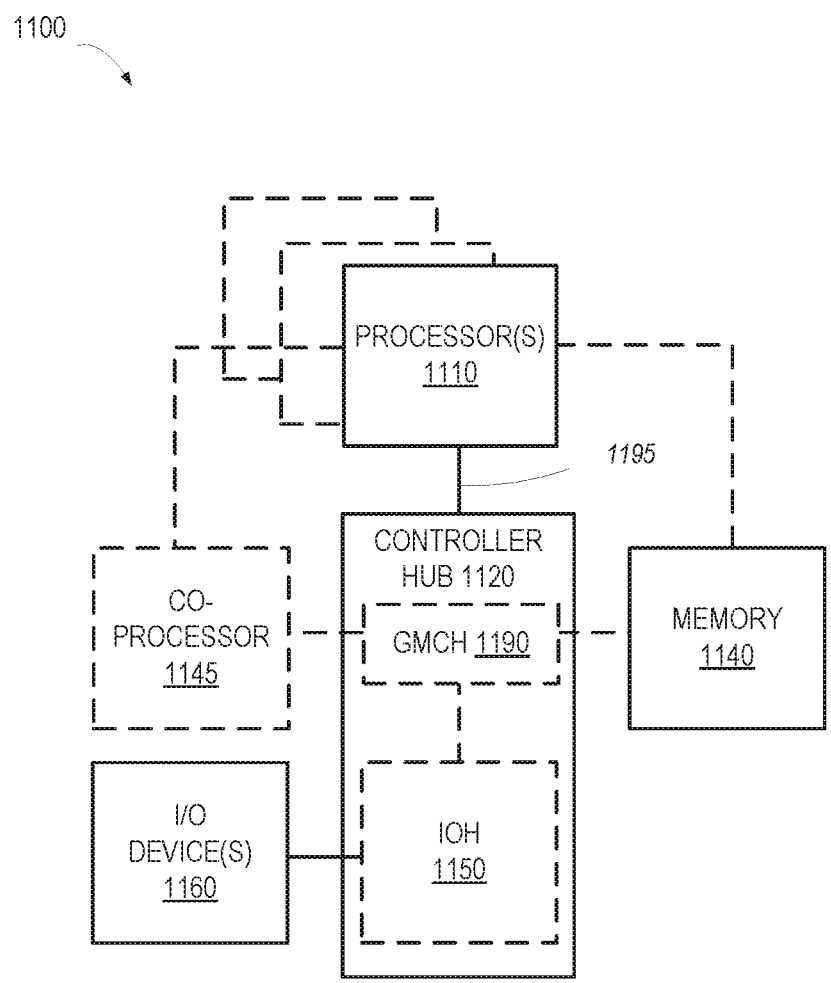
FIGS. 11-14 are block diagrams of exemplary computer architectures.
Figure 12:
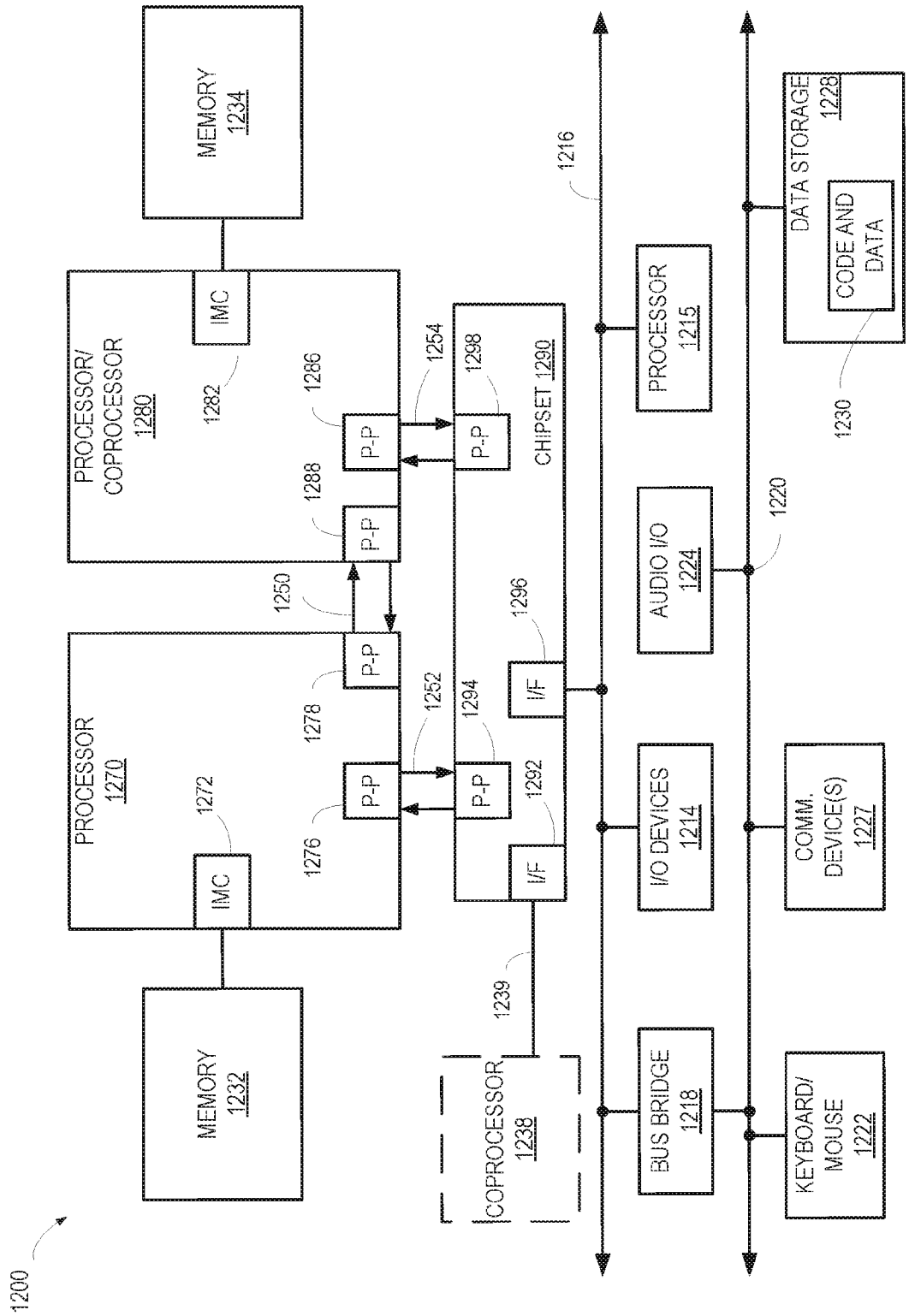
Figure 13:
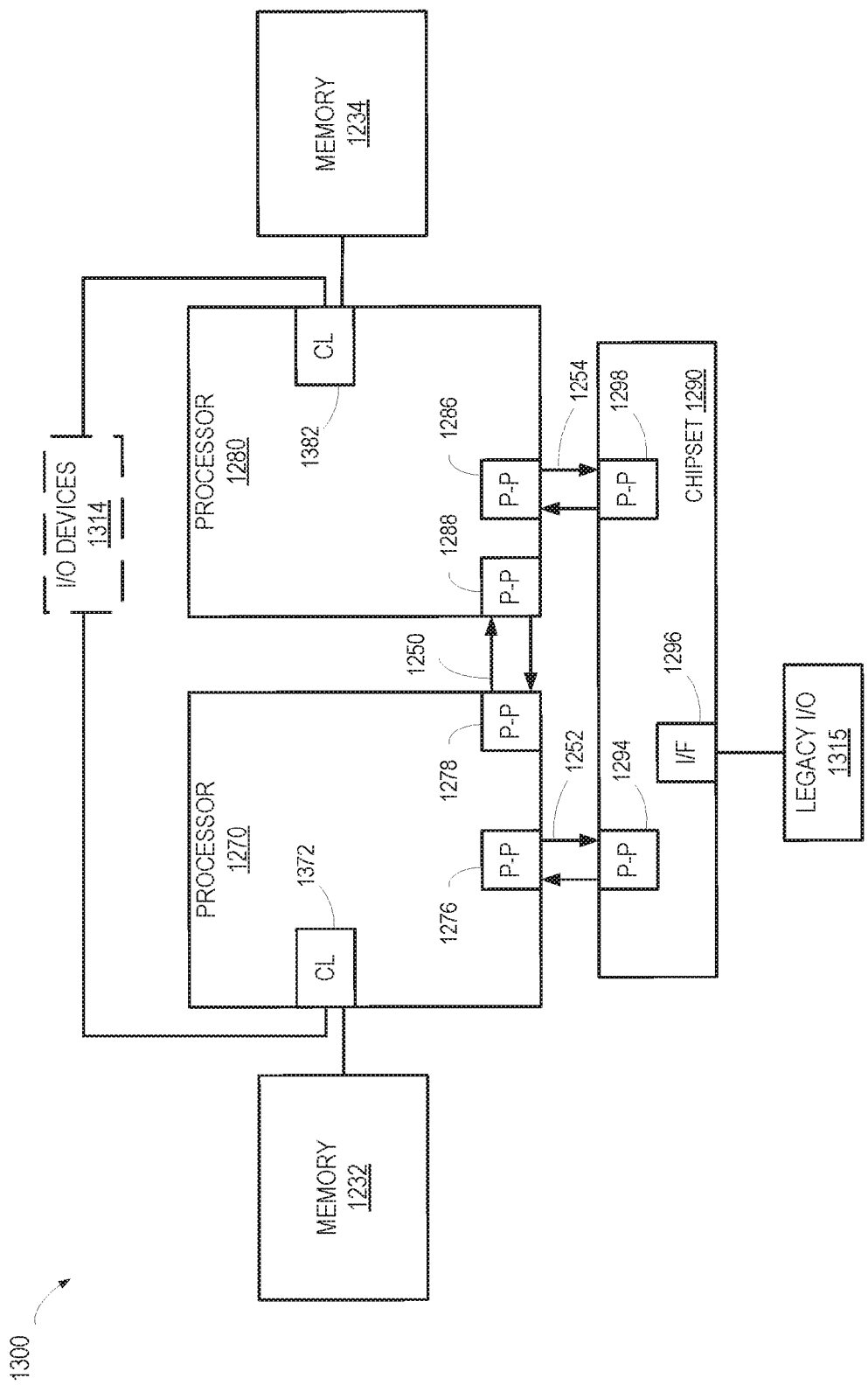
Figure 14:
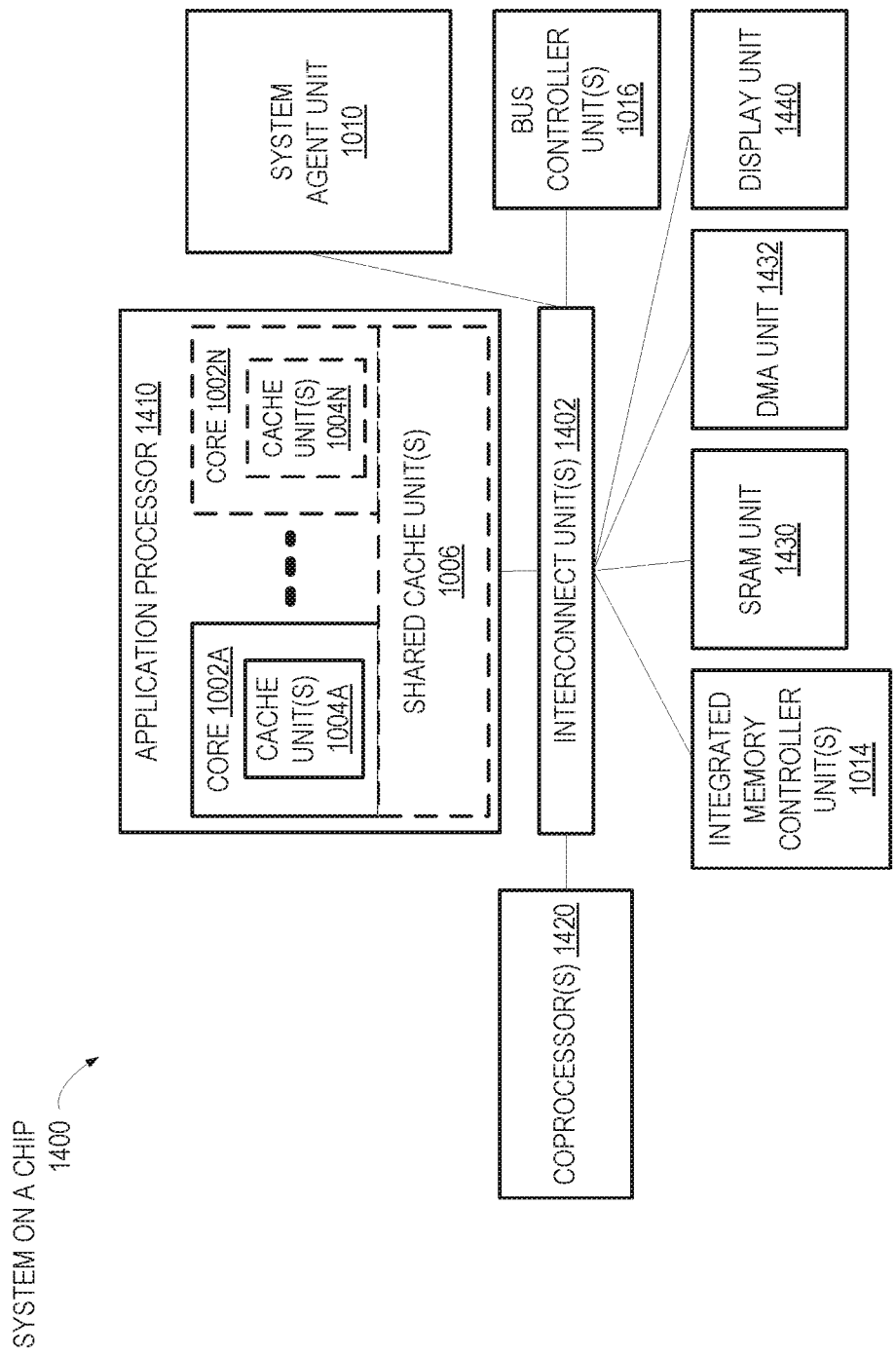

FIGS. 11 through 13 are block diagrams illustrating example systems suitable for the inclusion of one or more processors including, but not limited to, the processors described herein. FIG. 14 illustrates an example system on a chip (SoC) that may include one or more processor cores including, but not limited to, the processor cores described herein. Other system designs and configurations for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, may also be suitable for inclusion of the processors and/or processor cores described herein. In general, a huge variety of systems or electronic devices capable of incorporating a processor and/or other execution logic as disclosed herein are generally suitable for inclusion of the processors and/or processor cores described herein.

FIG. 11 is a block diagram illustrating a system 1100, in accordance with one embodiment of the present disclosure. As illustrated in this example, system 1100 may include one or more processors 1110, which are coupled to a controller hub 1120. In some embodiments, controller hub 1120 may include a graphics memory controller hub (GMCH) 1190 and an Input/Output Hub (IOH) 1150. In some embodiments, GMCH 1190 and IOH 1150 may be on separate chips. In this example, GMCH 1190 may include memory and graphics controllers (not shown) to which are coupled memory 1140 and a coprocessor 1145, respectively. In this example, IOH 1150 couples one or more input/output (I/O) devices 1160 to GMCH 1190. In various embodiments, one or both of the memory and graphics controllers may be integrated within the processor (as described herein), the memory 1140 and/or the coprocessor 1145 may be coupled directly to the processor(s) 1110, or the controller hub 1120 may be implemented in a single chip that includes the IOH 1150.

The optional nature of additional processors 1110 is denoted in FIG. 11 with broken lines. Each processor 1110 may include one or more of the processing cores described herein and may be implemented by a version of the processor 1000 illustrated in FIG. 10 and described herein.

In various embodiments, the memory 1140 may, for example, be dynamic random access memory (DRAM), phase change memory (PCM), or a combination of the two. In at least some embodiments, the controller hub 1120 may communicate with the processor(s) 1110 via a multi-drop bus such as a frontside bus (FSB), a point-to-point interface such as QuickPath Interconnect (QPI), or a similar connection, any one of which may be represented in FIG. 11 as interface 1195.

In one embodiment, the coprocessor 1145 may be a special purpose processor, such as, for example, a high-throughput MIC processor, a network or communication processor, a compression engine, a graphics processor, a GPGPU, an embedded processor, or another type of coprocessor. In one embodiment, controller hub 1120 may include an integrated graphics accelerator (not shown).

In some embodiments, there may be a variety of differences between the physical resources of different ones of the processors 1110. For example, there may be differences between the physical resources of the processors in terms of a spectrum of metrics of merit including architectural characteristics, micro-architectural characteristics, thermal characteristics, power consumption characteristics, and/or other performance-related characteristics.

In one embodiment, a processor 1110 may execute instructions that control data processing operations of a general type. Embedded within the instructions may be coprocessor instructions. The processor 1110 may recognize these coprocessor instructions as being of a type that should be executed by the attached coprocessor 1145. Accordingly, the processor 1110 may issue these coprocessor instructions (or control signals representing coprocessor instructions), on a coprocessor bus or other interconnect, to coprocessor 1145. Coprocessor(s) 1145 may accept and execute the received coprocessor instructions.

FIG. 12 is a block diagram illustrating a first example system 1200, in accordance with one embodiment of the present disclosure. As shown in FIG. 12, multiprocessor system 1200 implements a point-to-point interconnect system. For example, system 1200 includes a first processor 1270 and a second processor 1280 coupled to each other via a point-to-point interconnect 1250. In some embodiments, each of processors 1270 and 1280 may be a version of the processor 1000 illustrated in FIG. 10. In one embodiment, processors 1270 and 1280 may be implemented by respective processors 1110, while coprocessor 1238 may be implemented by a coprocessor 1145. In another embodiment, processors 1270 and 1280 may be implemented by a processor 1110 and a coprocessor 1145, respectively.

Processors 1270 and 1280 are shown including integrated memory controller (IMC) units 1272 and 1282, respectively. Processor 1270 also includes, as part of its bus controller units, point-to-point (P-P) interfaces 1276 and 1278. Similarly, processor 1280 includes P-P interfaces 1286 and 1288. Processors 1270 and 1280 may exchange information via a point-to-point (P-P) interface 1250 using P-P interface circuits 1278 and 1288. As shown in FIG. 12, IMCs 1272 and 1282 couple the processors to respective memories, shown as memory 1232 and memory 1234, which may be portions of a main memory that are locally attached to the respective processors.

Processors 1270 and 1280 may each exchange information with a chipset 1290 via individual P-P interfaces 1252 and 1254 respectively, using point to point interface circuits 1276, 1294, 1286, and 1298. Chipset 1290 may optionally exchange information with the coprocessor 1238 via interface 1292 over a high-performance interface 1239. In one embodiment, the coprocessor 1238 may be a special purpose processor, such as, for example, a high-throughput MIC processor, a network or communication processor, a compression engine, a graphics processor, a GPGPU, an embedded processor, or another type of special purpose processor. In one embodiment, coprocessor 1238 may include a high-performance graphics circuit and interface 1239 may be a high-performance graphics bus.

A shared cache (not shown) may be included in either processor or outside of both processors, yet may be connected with the processors via a P-P interconnect, such that either or both processors' local cache information may be stored in the shared cache if a processor is placed into a low power mode.

Chipset 1290 may be coupled to a first bus 1216 via an interface 1296. In various embodiments, first bus 1216 may be a Peripheral Component Interconnect (PCI) bus, a PCI Express bus, or another third generation I/O interconnect bus, although the scope of the present disclosure is not limited to these specific bus types.

As shown in FIG. 12, various I/O devices 1214 may be coupled to first bus 1216, along with a bus bridge 1218. Bus bridge 1218 may couple first bus 1216 to a second bus 1220. In one embodiment, one or more additional processor(s) 1215, such as one or more coprocessors, high-throughput MIC processors, GPGPU's, accelerators (e.g., graphics accelerators or digital signal processing (DSP) units), field programmable gate arrays, and/or any other processors, may be coupled to first bus 1216. In one embodiment, second bus 1220 may be a low pin count (LPC) bus. Various devices may be coupled to second bus 1220 including, for example, a keyboard and/or mouse 1222, one or more communication devices 1227 and a data storage unit 1228. Data storage unit 1228 may be a disk drive or another mass storage device, which may include instructions/code and data 1230, in one embodiment. In some embodiments, an audio I/O device 1224 may be coupled to the second bus 1220. Note that other architectures are possible. For example, instead of the point-to-point architecture illustrated in FIG. 12, a system may implement a multi-drop bus or another type of interconnect architecture.

FIG. 13 is a block diagram illustrating a second example system 1300, in accordance with one embodiment of the present disclosure. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processors 1270 and 1280 may include integrated memory and I/O control logic ("CL") units 1372 and 1382, respectively. Thus, CL 1372 and CL 1382 may include integrated memory controller units and may also include I/O control logic. FIG. 13 illustrates that not only are the memories 1232 and 1234 coupled to CL 1372 and CL 1382, respectively, but I/O devices 1314 are also coupled to CL 1372 and CL 1382. In this example system, legacy I/O devices 1315 may also be coupled to the chipset 1290 via an interface 1296.

FIG. 14 is a block diagram illustrating a system on a chip (SoC) 1400, in accordance with one embodiment of the present disclosure. Similar elements in FIGS. 14 and 10 bear like reference numerals. Also, dashed lined boxes represent optional features on more advanced SoCs. In FIG. 14, one or more interconnect unit(s) 1402 are coupled to an application processor 1410, which includes a set of one or more cores 1002A-1002N, including respective local cache units 1004A-1004N, and shared cache unit(s) 1006. The interconnect unit(s) 1402 are also coupled to a system agent unit 1010, one or more bus controller unit(s) 1016, one or more integrated memory controller unit(s) 1014, a set of one or more coprocessors 1420, a static random access memory (SRAM) unit 1430, a direct memory access (DMA) unit 1432, and a display unit 1440 for coupling to one or more external displays. In one embodiment, the coprocessor(s) 1420 may include a special purpose processor, such as, for example, a network or communication processor, a compression engine, a GPGPU, a high-throughput MIC processor, an embedded processor, or another type of coprocessor. In another embodiment, the coprocessor(s) 1420 may be a media processor that includes integrated graphics logic, an image processor, an audio processor, and/or a video processor.

In various embodiments, the mechanisms disclosed herein may be implemented in hardware, software, firmware, or a combination of such implementation approaches. Some embodiments of the disclosure may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and to generate output information. The output information may be applied to one or more output devices, in known fashion. For purposes of this disclosure, a processing system may include any system that includes a processor, such as, for example, a digital signal processor (DSP), a microcontroller, an application specific integrated circuit (ASIC), or a microprocessor.

In some embodiments, the program code may be implemented in a high level procedural or object oriented programming language to communicate with a processing system. The program code may also be implemented in assembly or machine language, in other embodiments. In fact, the mechanisms described herein are not limited in scope to any particular programming language. In general, the programming language may be a compiled language or an interpreted language.

One or more aspects of at least one embodiment may be implemented by representative instructions stored on a non-transitory, machine-readable medium which represents various logic within the processor, which when read by a machine causes the machine to fabricate logic to perform the techniques described herein. Such representations, sometimes referred to as "IP cores", may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable memories (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off the processor.

Figure 15:
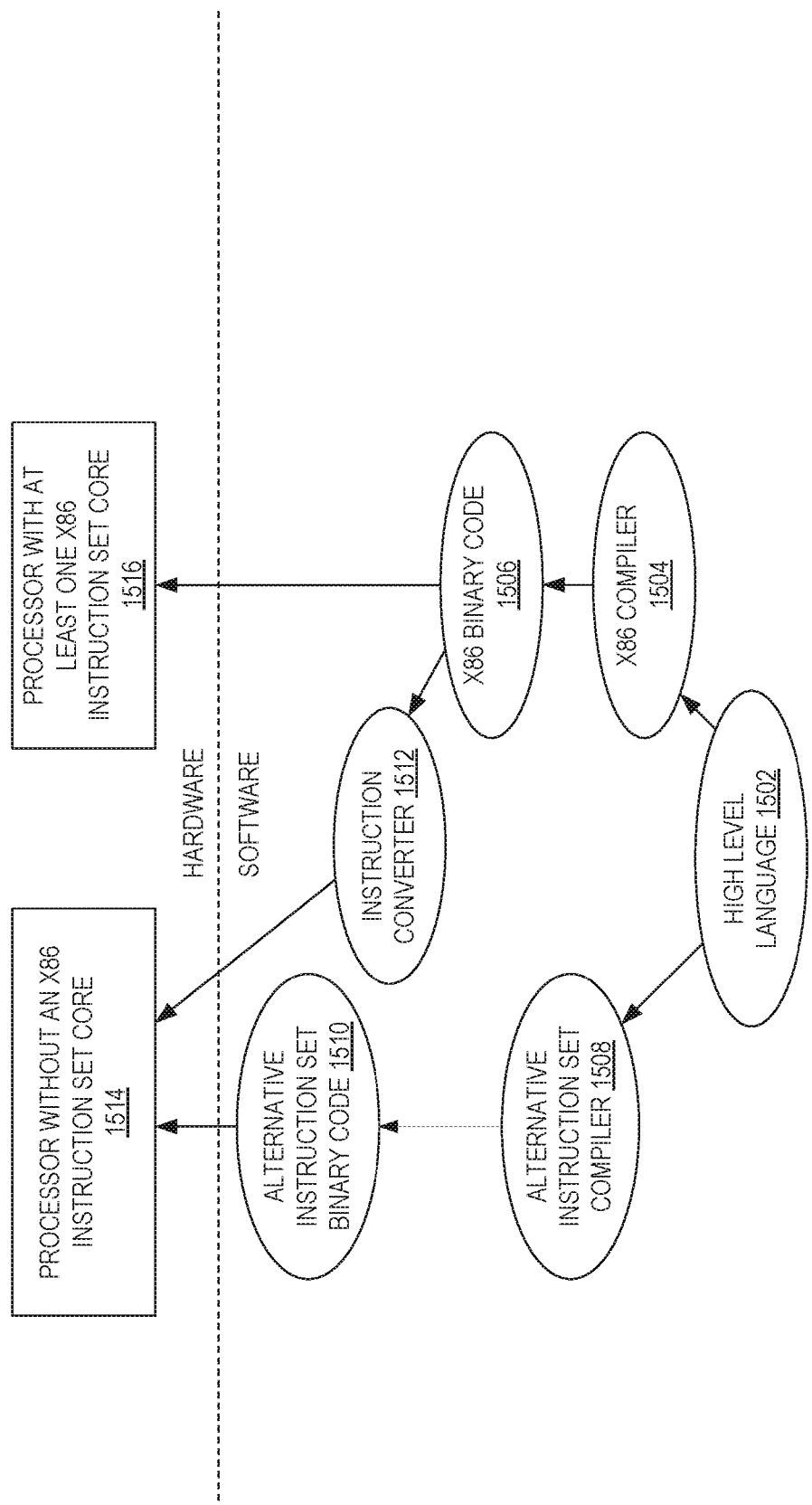
FIG. 15 is a block diagram contrasting the use of a software instruction converter to convert binary instructions in a source instruction set to binary instructions in a target instruction set according to embodiments of the invention.

FIG. 15 is a block diagram illustrating the use of a compiler and a software instruction converter to convert binary instructions in a source instruction set to binary instructions in a target instruction set, according to some embodiments. In the illustrated embodiment, the instruction converter may be a software instruction converter, although in other embodiments the instruction converter may be implemented in software, firmware, hardware, or various combinations thereof. FIG. 15 illustrates that a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that may perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that may be operable to generate x86 binary code 1506 (e.g., object code) that may, with or without additional linkage processing, be executed on the processor with at least one x86 instruction set core 1516. Similarly, FIG. 15 illustrates that the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). Instruction converter 1512 may be used to convert x86 binary code 1506 into code that may be natively executed by the processor without an x86 instruction set core 1514. This converted code might not be the same as the alternative instruction set binary code 1510; however, the converted code will accomplish the general operation and be made up of instructions from the alternative instruction set. Thus, instruction converter 1512 represents software, firmware, hardware, or a combination thereof that, through emulation, simulation or any other process, allows a processor or other electronic device that does not have an x86 instruction set processor or core to execute x86 binary code 1506.

Thus, techniques for performing one or more instructions according to at least one embodiment are disclosed. While certain example embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

In some embodiments of the present disclosure, a processor may include a decoder to decode an instruction and an execution unit for executing the instruction. The instruction may be to compress an input data stream. The execution unit may generate metadata for a current input of the input data stream, select a first pointer in a hash chain, determine whether the metadata generated for the current input matches metadata previously generated for the first pointer, and filter the first pointer from a search for a best match for the current input in the history buffer. The metadata may comprise a first hint based on at least a portion of a current input that represents the input data stream at a current offset. The first pointer may identify a location in a history buffer. The filter of the first pointer may be based on the determination that at least a portion of the metadata generated for the current input does not match a portion of the metadata previously generated for the first pointer.

In combination with any of the above embodiments, in an embodiment the execution unit may select a second pointer in the hash chain, the second pointer to identify another location in the history buffer, determine whether the metadata generated for the current input matches metadata previously generated for the second pointer, and compare the data at the other location in the history buffer to the current input based on the determination that the metadata of the current input matches the metadata of the second pointer. In combination with any of the above embodiments, in an embodiment the metadata generated for the current input further comprises a second hint. The second hint may be associated with a second match length and the first hint may be associated with a first match length, the second match length may be greater than the first match length. The execution unit may mask the second hint from the determination whether the metadata generated for the current input matches the metadata previously generated for the first pointer. In combination with any of the above embodiments, in an embodiment the metadata generated for the current input may include a second hint. The second hint may be associated with a second match length and the first hint may be associated with a first match length. The second match length may be greater than the first match length. The execution unit may mask the second hint from the determination whether the metadata generated for the current input matches the metadata previously generated for the second pointer, determine a match length based on the comparison of the data at the other location in the history buffer to the current input, select a third pointer in the hash chain, the third pointer may be to identify a third location in the history buffer, determine whether the metadata generated for the current input matches metadata previously generated for the third pointer, and, in response to the determination of the match length, unmask the second hint from the determination whether metadata of the current input matches metadata of the third pointer. In combination with any of the above embodiments, in an embodiment the second match length may be at least two bytes longer than the first match length. The execution unit may mask one or more hints associated with match lengths between the first match length and the second match length from the determination whether the metadata generated for the current input matches the metadata previously generated for the first pointer. In combination with any of the above embodiments, in an embodiment the first hint and the second hint may be based on a hash value that may be generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The execution unit may mask the second hint from the determination whether the metadata generated for the current input matches the metadata previously generated for the second pointer, determine a match length based on the comparison of the data at the other location in the history buffer to the current input, the match length corresponding to a best match length among a plurality of comparisons between data in the history buffer and the current input, in response to the determination of the match length, unmask the second hint from a determination whether the metadata of the current input matches metadata of a third pointer, and select the third pointer in the hash chain, the third pointer may be to identify a third location in the history buffer.

In some embodiments of the present disclosure, a method may include decoding a command, the command to compress an input data stream, generating metadata for a current input of the input data stream, selecting a first pointer in a hash chain, determining whether the metadata generated for the current input matches metadata previously generated for the first pointer, and filtering the first pointer from a search for a best match of the current input in the history buffer. The metadata may include a first hint based on at least a portion of a current input that represents the input data stream at a current offset. The first pointer may identify a location in the history buffer. The filter may be based on the determination that at least a portion of the metadata generated for the current input does not match a portion of the metadata previously generated for the first pointer.

In combination with any of the above embodiments, in an embodiment the method may include selecting a second pointer in the hash chain, the second pointer identifying another location in the history buffer, determining whether the metadata generated for the current input matches metadata previously generated for the second pointer, and comparing the data at the other location in the history buffer to the current input based on the determination that the metadata of the current input matches the metadata of the second pointer. In combination with any of the above embodiments, in an embodiment the generated metadata may include a second hint, the second hint may be associated with a second match length and the first hint may be associated with a first match length, the second match length may be greater than the first match length. The method may include masking the second hint from the determination whether the metadata generated for the current input matches the metadata previously generated for the first pointer. In combination with any of the above embodiments, in an embodiment the generated metadata further comprises a second hint, the second hint may be associated with a second match length and the first hint may be associated with a first match length, the second match length being greater than the first match length. The method may include masking the second hint from the determination whether the metadata generated for the current input matches the metadata previously generated for the second pointer, determining a length of the match based on the comparison of the data at the other location in the history buffer to the current input, selecting a third pointer, the third pointer identifying a third location in the history buffer, and in response to determining the match length, unmasking the second hint from the determination whether the metadata of the current input matches the metadata of the third pointer. In combination with any of the above embodiments, in an embodiment the number of bits used for the second hint and the first hint are different. In combination with any of the above embodiments, in an embodiment the second match length may be at least two bytes longer than the first match length. The method may include masking one or more hints associated with match lengths between the first match length and the second match length from the determination whether the metadata generated for the current input matches the metadata previously generated for the first pointer. In combination with any of the above embodiments, in an embodiment the first hint and the second hint may be based on a hash value generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The method may include masking the second hint from the determination whether the metadata generated for the current input matches the metadata previously generated for the second pointer, determining a match length based on the comparison of the data at the other location in the history buffer to the current input, the match length corresponding to a best match length among a plurality of comparisons between data in the history buffer and the current input, in response to determining the match length, unmasking the second hint from a determination whether the metadata of the current input matches metadata of a third pointer, and selecting the third pointer in the hash chain, the third pointer may be to identify a third location in the history buffer.

In some embodiments of the present disclosure, a system may include a decoder to decode an instruction and an execution unit for executing the instruction. The instruction may be to compress an input data stream. The execution unit may generate metadata for a current input of the input data stream, select a first pointer in a hash chain, determine whether the metadata generated for the current input matches metadata previously generated for the first pointer, and filter the first pointer from a search for a best match for the current input in the history buffer. The metadata may comprise a first hint based on at least a portion of a current input that represents the input data stream at a current offset. The first pointer may identify a location in a history buffer. The filter the first pointer may be based on the determination that at least a portion of the metadata generated for the current input does not match a portion of the metadata previously generated for the first pointer.

In combination with any of the above embodiments, in an embodiment the execution unit may select a second pointer in the hash chain, the second pointer to identify another location in the history buffer, determine whether the metadata generated for the current input matches metadata previously generated for the second pointer, and compare the data at the other location in the history buffer to the current input based on the determination that the metadata of the current input matches the metadata of the second pointer. In combination with any of the above embodiments, in an embodiment the metadata generated for the current input further comprises a second hint. The second hint may be associated with a second match length and the first hint may be associated with a first match length, the second match length may be greater than the first match length. The execution unit may mask the second hint from the determination whether the metadata generated for the current input matches the metadata previously generated for the first pointer. In combination with any of the above embodiments, in an embodiment the metadata generated for the current input may include a second hint. The second hint may be associated with a second match length and the first hint may be associated with a first match length. The second match length may be greater than the first match length. The execution unit may mask the second hint from the determination whether the metadata generated for the current input matches the metadata previously generated for the second pointer, determine a match length based on the comparison of the data at the other location in the history buffer to the current input, select a third pointer in the hash chain, the third pointer may be to identify a third location in the history buffer, determine whether the metadata generated for the current input matches metadata previously generated for the third pointer, and in response to the determination of the match length, unmask the second hint from the determination whether metadata of the current input matches metadata of the third pointer. In combination with any of the above embodiments, in an embodiment the second match length may be at least two bytes longer than the first match length. The execution unit may mask one or more hints associated with match lengths between the first match length and the second match length from the determination whether the metadata generated for the current input matches the metadata previously generated for the first pointer. In combination with any of the above embodiments, in an embodiment the first hint and the second hint may be based on a hash value that may be generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The execution unit may mask the second hint from the determination whether the metadata generated for the current input matches the metadata previously generated for the second pointer, determine a match length based on the comparison of the data at the other location in the history buffer to the current input, the match length corresponding to a best match length among a plurality of comparisons between data in the history buffer and the current input, in response to the determination of the match length, unmask the second hint from a determination whether the metadata of the current input matches metadata of a third pointer, and select the third pointer in the hash chain, the third pointer may be to identify a third location in the history buffer.

In some embodiments of the present disclosure, a data compression unit may be for compressing data. The data compression unit may receive a command for data compression of an input data stream, generate metadata for a current input of the input data stream, select a first pointer in a hash chain, determine whether the metadata generated for the current input matches metadata previously generated for the first pointer, and filter the first pointer from a search for a best match for the current input in the history buffer. The metadata may include a first hint based on at least a portion of a current input that represents the input data stream at a current offset. The first pointer may be to identify a location in a history buffer. The filter may be based on the determination that at least a portion of the metadata generated for the current input does not match a portion of the metadata previously generated for the first pointer.

In combination with any of the above embodiments, in an embodiment the data compression unit may select a second pointer in the hash chain, determine whether metadata generated for the current input matches metadata previously generated for the second pointer, and compare the data at the other location in the history buffer to the current input. The second pointer may be to identify another location in the history buffer. The compare may be based on the determination that the metadata of the current input matches the metadata of the second pointer. In combination with any of the above embodiments, in an embodiment the metadata generated for the current input may include a second hint. The second hint may be associated with a second match length and the first hint may be associated with a first match length. The second match length may be greater than the first match length. The data compression unit may mask the second hint from the determination whether the metadata generated for the current input matches the metadata previously generated for the first pointer. In combination with any of the above embodiments, in an embodiment the metadata generated for the current input may include a second hint. The second hint may be associated with a second match length and the first hint may be associated with a first match length. The second match length may be greater than the first match length. The data compression unit may mask the second hint from the determination whether the metadata generated for the current input matches the metadata previously generated from the second pointer, determine a match length based on the comparison of the data at the other location in the history buffer to the current input, select a third pointer in the hash chain, the third pointer to identify a third location in the history buffer, determine whether the metadata generated for the current input matches metadata previously generated for the third pointer, circuitry to, in response to the determination of the match length, unmask the second hint from the determination whether metadata of the current input matches metadata of the third pointer. In combination with any of the above embodiments, in an embodiment the number of bits used for the second hint and first hint are different. In combination with any of the above embodiments, in an embodiment the second may length may be at least two bytes longer than the first match length. The data compression unit may mask one or more hints associated with match lengths between the first match length and the second match length from the determination whether the metadata generated for the current input matches the metadata previously generated for the first pointer. In combination with any of the above embodiments, in an embodiment the first hint and the second hint may be based on a hash value generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The data compression unit may mask the second hint from the determination whether the metadata generated for the current input matches the metadata previously generated for the second pointer, determine a match length based on the comparison of the data at the other location in the history buffer to the current input, the match length corresponding to a best match length among a plurality of comparisons between data in the history buffer and the current input, circuitry to, in response to the determination of the match length, unmask the second hint from a determination whether the metadata of the current input matches metadata of a third pointer, and select the third pointer in the hash chain, the third pointer to identify a third location in the history buffer.

In some embodiments of the present disclosure, an apparatus may include means for decoding a command, the command to compress an input data stream, means for generating metadata for a current input of the input data stream, means for selecting a first pointing means in a hash chain, means for determining whether the metadata generated for the current input matches metadata previously generated for the first pointing means, and means for filtering the first pointing means from a search for a best match of the current input in the history buffer. The metadata may include a first hint based on at least a portion of a current input that represents the input data stream at a current offset. The first pointing means may identify a location in the history buffer. The means for filtering may be based on the means for determining that at least a portion of the metadata generated for the current input does not match a portion of the metadata previously generated for the first pointing means.

In combination with any of the above embodiments, in an embodiment the apparatus may include means for selecting a second pointing means in the hash chain, the second pointing means identifying another location in the history buffer, means for determining whether the metadata generated for the current input matches metadata previously generated for the second pointing means, and means for comparing the data at the other location in the history buffer to the current input based on the determination that the metadata of the current input matches the metadata of the second pointing means. In combination with any of the above embodiments, in an embodiment the generated metadata may include a second hint, the second hint may be associated with a second match length and the first hint may be associated with a first match length, the second match length may be greater than the first match length. The apparatus may include means for masking the second hint from the determination whether the metadata generated for the current input matches the metadata previously generated for the first pointing means. In combination with any of the above embodiments, in an embodiment the generated metadata further comprises a second hint, the second hint may be associated with a second match length and the first hint may be associated with a first match length, the second match length being greater than the first match length. The apparatus may include means for masking the second hint from the determination whether the metadata generated for the current input matches the metadata previously generated for the second pointing means, means for determining a length of the match based on the comparison of the data at the other location in the history buffer to the current input, means for selecting a third pointing means, the third pointing means identifying a third location in the history buffer, and in response to the means for determining the match length, means for unmasking the second hint from the determination whether the metadata of the current input matches the metadata of the third pointing means. In combination with any of the above embodiments, in an embodiment the number of bits used for the second hint and the first hint are different. In combination with any of the above embodiments, in an embodiment the second match length may be at least two bytes longer than the first match length. The apparatus may include means for masking one or more hints associated with match lengths between the first match length and the second match length from the determination whether the metadata generated for the current input matches the metadata previously generated for the first pointing means. In combination with any of the above embodiments, in an embodiment the first hint and the second hint may be based on a hash value generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The apparatus may include means for masking the second hint from the determination whether the metadata generated for the current input matches the metadata previously generated for the second pointing means, means for determining a match length based on the comparison of the data at the other location in the history buffer to the current input, the match length corresponding to a best match length among a plurality of comparisons between data in the history buffer and the current input, in response to the means for determining the match length, means for unmasking the second hint from a determination whether the metadata of the current input matches metadata of a third pointing means, and means for selecting the third pointing means in the hash chain, the third pointing means may be to identify a third location in the history buffer.

In some embodiments of the present disclosure, at least one machine readable storage medium may include computer-executable instructions. The instructions may be readable by a processor, when read and executed by the processor, for causing the processor to decode a command, the command to compress an input data stream, generate metadata for a current input of the input data stream, select a first pointer in a hash chain, determine whether the metadata generated for the current input matches metadata previously generated for the first pointer, and filter the first pointer from a search for a best match of the current input in the history buffer. The metadata may include a first hint based on at least a portion of a current input that represents the input data stream at a current offset. The first pointer may identify a location in the history buffer. The filter may be based on the determination that at least a portion of the metadata generated for the current input does not match a portion of the metadata previously generated for the first pointer.

In combination with any of the above embodiments, in an embodiment the instructions may cause the processor to select a second pointer in the hash chain, the second pointer identifying another location in the history buffer, determine whether the metadata generated for the current input matches metadata previously generated for the second pointer, and compare the data at the other location in the history buffer to the current input based on the determination that the metadata of the current input matches the metadata of the second pointer. In combination with any of the above embodiments, in an embodiment the generated metadata may include a second hint, the second hint may be associated with a second match length and the first hint may be associated with a first match length, the second match length may be greater than the first match length. The instructions may cause the processor to mask the second hint from the determination whether the metadata generated for the current input matches the metadata previously generated for the first pointer. In combination with any of the above embodiments, in an embodiment the generated metadata further comprises a second hint, the second hint may be associated with a second match length and the first hint may be associated with a first match length, the second match length being greater than the first match length. The instructions may cause the processor to mask the second hint from the determination whether the metadata generated for the current input matches the metadata previously generated for the second pointer, determine a length of the match based on the comparison of the data at the other location in the history buffer to the current input, select a third pointer, the third pointer identifying a third location in the history buffer, and in response to a determination of the match length, unmask the second hint from the determination whether the metadata of the current input matches the metadata of the third pointer. In combination with any of the above embodiments, in an embodiment the number of bits used for the second hint and the first hint are different. In combination with any of the above embodiments, in an embodiment the second match length may be at least two bytes longer than the first match length. The instructions may cause the processor to mask one or more hints associated with match lengths between the first match length and the second match length from the determination whether the metadata generated for the current input matches the metadata previously generated for the first pointer. In combination with any of the above embodiments, in an embodiment the first hint and the second hint may be based on a hash value generated based on all bytes of the current input of the input data stream. In combination with any of the above embodiments, in an embodiment the metadata generated for the current input may include a second hint. The second hint may be associated with a second match length and the first hint may be associated with a first match length. The second match length may be greater than the first match length. The instructions may cause the processor to mask the second hint from the determination whether the metadata generated for the current input matches the metadata previously generated for the second pointer, determine a match length based on the comparison of the data at the other location in the history buffer to the current input, the match length corresponding to a best match length among a plurality of comparisons between data in the history buffer and the current input, in response to a determination of the match length, unmask the second hint from a determination whether the metadata of the current input matches metadata of a third pointer, and selecting the third pointer in the hash chain, the third pointer may be to identify a third location in the history buffer.

What is claimed is:

1. A processor, comprising:
a decoder to decode an instruction, the instruction to compress an input data stream; and
an execution unit to execute the instruction, wherein the execution unit is to:
generate metadata for a particular input of the input data stream, the metadata is to comprise a first hint based on at least a portion of the particular input that represents the input data stream at a particular offset;
select a first pointer to identify a location in a history buffer;
determine whether the metadata generated for the particular input matches metadata previously generated for the first pointer; and
filter the first pointer from a search for a best match for the particular input in the history buffer based on the determination that at least a portion of the metadata generated for the particular input does not match a portion of the metadata previously generated for the first pointer.

2. The processor of claim 1, wherein the execution unit is further to:
select a second pointer to identify another location in the history buffer;
determine whether the metadata generated for the particular input matches metadata previously generated for the second pointer; and
compare data at the other location in the history buffer to the particular input based on the determination that the metadata of the particular input matches the metadata of the second pointer.

3. The processor of claim 2, wherein:
the first pointer is selected from a hash chain;
the metadata generated for the particular input further comprises:
a second hint, the second hint associated with a second match length and the first hint associated with a first match length, the second match length being greater than the first match length; and
the execution unit is further to:
mask the second hint from the determination whether the metadata generated for the particular input matches the metadata previously generated for the second pointer;
determine a match length based on the comparison of the data at the other location in the history buffer to the particular input;
select a third pointer in the hash chain, the third pointer to identify a third location in the history buffer;
determine whether the metadata generated for the particular input matches metadata previously generated for the third pointer; and
in response to the determination of the match length, unmask the second hint from the determination whether metadata of the particular input matches metadata of the third pointer.

4. The processor of claim 1, wherein:
the metadata generated for the particular input further comprises a second hint, the second hint associated with a second match length and the first hint associated with a first match length, the second match length being greater than the first match length; and
the execution unit is further to:
mask the second hint from the determination whether the metadata generated for the particular input matches the metadata previously generated for the first pointer.

5. The processor of claim 4, wherein the number of bits used for the second hint and the first hint are different.

6. The processor of claim 4, wherein:
the second match length is at least two bytes longer than the first match length; and
the execution unit is further to:
mask one or more hints associated with match lengths between the first match length and the second match length from the determination whether the metadata generated for the particular input matches the metadata previously generated for the first pointer.

7. The processor of claim 4, wherein the first hint and second hint are based on a hash value generated based on all bytes of the particular input of the input data stream.

8. A method, comprising:
decoding a command, the command to compress an input data stream;
generating metadata for a particular input of the input data stream, the metadata comprising a first hint based on at least a portion of the particular input that represents the input data stream at a particular offset;
selecting a first pointer identifying a location in a history buffer;
determining whether the metadata generated for the particular input matches metadata previously generated for the first pointer; and
filtering the first pointer from a search for a best match for the particular input in the history buffer based on the determination that at least a portion of the metadata generated for the particular input does not match a portion of the metadata previously generated for the first pointer.

9. The method of claim 8, further comprising:
selecting a second pointer identifying another location in the history buffer;
determining whether the metadata generated for the particular input matches metadata previously generated for the second pointer; and
comparing data at the other location in the history buffer to the particular input based on the determination that the metadata of the particular input matches the metadata of the second pointer.

10. The method of claim 9, wherein:
the first pointer is selected from a hash chain;
the generated metadata further comprises a second hint, the second hint associated with a second match length and the first hint associated with a first match length, the second match length being greater than the first match length; and
the method further comprising:
masking the second hint from the determination whether the metadata generated for the particular input matches the metadata previously generated for the second pointer;
determining a length of the match based on the comparison of the data at the other location in the history buffer to the particular input;

selecting a third pointer, the third pointer identifying a third location in the history buffer; and in response to determining the match length, unmasking the second hint from the determination whether the metadata of the particular input matches the metadata of the third pointer.

11. The method of claim 8, wherein:

the generated metadata further comprises a second hint, the second hint associated with a second match length and the first hint associated with a first match length, the second match length being greater than the first match length; and the method further comprising:

masking the second hint from the determination whether the metadata generated for the particular input matches the metadata previously generated for the first pointer.

12. The method of claim 11, wherein the number of bits used for the second hint and the first hint are different.

13. The method of claim 11, wherein:

the second match length is at least two bytes longer than the first match length; and the method further comprising:

masking one or more hints associated with match lengths between the first match length and the second match length from the determination whether the metadata generated for the particular input matches the metadata previously generated for the first pointer.

14. A data compression unit for compressing data, wherein the data compression unit is to:

receive a command for data compression of an input data stream;

generate metadata for a particular input of the input data stream, the metadata is to comprise a first hint based on at least a portion of the particular input that represents the input data stream at a particular offset;

select a first pointer in a hash chain, the first pointer to identify a location in a history buffer;

determine whether the metadata generated for the particular input matches metadata previously generated for the first pointer; and filter the first pointer from a search for a best match for the particular input in the history buffer based on the determination that at least a portion of the metadata generated for the particular input does not match a portion of the metadata previously generated for the first pointer.

15. The data compression unit of claim 14, wherein the data compression unit is further to:

select a second pointer in the hash chain, the second pointer to identify another location in the history buffer;

determine whether metadata generated for the particular input matches metadata previously generated for the second pointer; and compare data at the other location in the history buffer to the particular input based on the determination that the metadata of the particular input matches the metadata of the second pointer.

16. The data compression unit of claim 15, wherein:

the metadata generated for the particular input further comprises:

a second hint, the second hint associated with a second match length and the first hint associated with a first match length, the second match length being greater than the first match length; and the data compression unit is further to:

mask the second hint from the determination whether the metadata generated for the particular input matches the metadata previously generated from the second pointer;

determine a match length based on the comparison of the data at the other location in the history buffer to the particular input;

select a third pointer in the hash chain, the third pointer to identify a third location in the history buffer;

determine whether the metadata generated for the particular input matches metadata previously generated for the third pointer; and in response to the determination of the match length, unmask the second hint from the determination whether metadata of the particular input matches metadata of the third pointer.

17. The data compression unit of claim 14, wherein:

the metadata generated for the particular input further comprises a second hint, the second hint associated with a second match length and the first hint associated with a first match length, the second match length being greater than the first match length; and the data compression unit is further to:

mask the second hint from the determination whether the metadata generated for the particular input matches the metadata previously generated for the first pointer.

18. The data compression unit of claim 17, wherein the number of bits used for the second hint and the first hint are different.

19. The data compression unit of claim 17, wherein:

the second match length is at least two bytes longer than the first match length; and the data compression unit is further to:

mask one or more hints associated with match lengths between the first match length and the second match length from the determination whether the metadata generated for the particular input matches the metadata previously generated for the first pointer.

20. The data compression unit of claim 17, wherein the first hint and second hint are based on a hash value generated based on all bytes of the particular input of the input data stream.

* * * * *